(12) United States Patent
Guthrie et al.

(10) Patent No.: US 10,635,766 B2
(45) Date of Patent: Apr. 28, 2020

(54) SIMULATION EMPLOYING LEVEL-DEPENDENT MULTITYPE EVENTS

(71) Applicant: INTERNATIONAL BUSINESS MACHINES CORPORATION, Armonk, NY (US)

(72) Inventors: Guy L. Guthrie, Austin, TX (US); Hugh Shen, Round Rock, TX (US); Derek E. Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 578 days.

(21) Appl. No.: 15/376,262

(22) Filed: Dec. 12, 2016

(65) Prior Publication Data

US 2018/0165392 A1 Jun. 14, 2018

(51) Int. Cl.
*G06F 17/50* (2006.01)
(52) U.S. Cl.
CPC ................. *G06F 17/5022* (2013.01)
(58) Field of Classification Search
CPC .................................................. G06F 17/5022
USPC .......................................................... 703/15
See application file for complete search history.

(56) References Cited

U.S. PATENT DOCUMENTS

| | | | |
|---|---|---|---|
| 5,212,650 A | 5/1993 | Hooper et al. | |
| 5,369,753 A | 11/1994 | Tipley | |
| 5,369,763 A | 11/1994 | Biles | |
| 5,604,895 A | 2/1997 | Raimi | |
| 5,870,588 A | 2/1999 | Rompaey et al. | |
| 6,052,809 A | 4/2000 | Bowden | |
| 6,053,947 A | 4/2000 | Parson | |
| 6,077,304 A | 6/2000 | Kasuya | |
| 6,117,181 A | 9/2000 | Dearth et al. | |
| 6,195,627 B1 | 2/2001 | Bargh et al. | |
| 6,195,629 B1 | 2/2001 | Bargh et al. | |
| 6,202,042 B1 | 3/2001 | Bargh et al. | |
| 6,212,491 B1 | 4/2001 | Bargh et al. | |
| 6,223,142 B1 | 4/2001 | Bargh et al. | |

(Continued)

OTHER PUBLICATIONS

Karthik et al. Distributed mixed level logic and fault simulation on the Pentium/sup (R/)Pro microprocessor; Proceedings International Test Conference 1996. Test and Design Validity; 1996; pp. 160-166. (Year: 1996).*

(Continued)

*Primary Examiner* — Hugh M Jones
(74) *Attorney, Agent, or Firm* — Brian F. Russell; David Quinn

(57) ABSTRACT

In a data processing system, a processor creating level qualifying logic within instrumentation of a hardware description language (HDL) simulation model of a design. The level qualifying logic is configured to generate a first event of a first type for a first simulation level and to generate a second event of second type for a second simulation level. The processor simulates the design utilizing the HDL simulation model, where the simulation includes generating the first event of the first type responsive to the simulating being performed at the first simulation level and generating the second event of the second type responsive to the simulating being performed at the second simulation level. Responsive to the simulating, the processor records, within data storage, at least one occurrence of an event from a set including the first event and the second event.

15 Claims, 25 Drawing Sheets

(56) References Cited

U.S. PATENT DOCUMENTS

| | | |
|---|---|---|
| 6,285,914 B1 | 9/2001 | Bae et al. |
| 6,295,623 B1 | 9/2001 | Lesmeister et al. |
| 6,345,242 B1 | 2/2002 | Dearth et al. |
| 6,393,426 B1 | 5/2002 | Odom et al. |
| 6,466,898 B1 | 10/2002 | Chan |
| 6,470,478 B1 | 10/2002 | Bargh et al. |
| 6,490,711 B2 | 12/2002 | Buckley, Jr. |
| 6,519,612 B1 | 2/2003 | Howard et al. |
| 6,546,532 B1 | 4/2003 | Kerzman et al. |
| 6,581,191 B1 | 6/2003 | Schubert et al. |
| 6,606,588 B1 | 8/2003 | Schaumont et al. |
| 6,618,839 B1 | 9/2003 | Beardslee et al. |
| 6,668,364 B2 | 12/2003 | McElvain et al. |
| 6,687,710 B1 | 2/2004 | Dey |
| 6,720,565 B2 | 4/2004 | Innes et al. |
| 6,751,583 B1 | 6/2004 | Clarke et al. |
| 6,754,763 B2 | 6/2004 | Lin |
| 6,920,418 B2 | 7/2005 | Roesner et al. |
| 6,934,885 B2 | 8/2005 | Gabele et al. |
| 7,006,960 B2 | 2/2006 | Schaumont et al. |
| 7,020,850 B2 | 3/2006 | Raghavan et al. |
| 7,158,924 B2 | 1/2007 | Williams et al. |
| 7,206,732 B2 | 4/2007 | Williams et al. |
| 7,392,169 B2 | 6/2008 | Gabele et al. |
| 7,454,325 B2 | 11/2008 | Behm et al. |
| 7,493,248 B2 | 2/2009 | Bobok et al. |
| 7,529,655 B2 | 5/2009 | Gabele et al. |
| 7,617,085 B2 | 11/2009 | Bobok et al. |
| 7,711,537 B2 | 5/2010 | Bobok et al. |
| 7,835,899 B2 | 11/2010 | Roesner et al. |
| 8,108,199 B2 | 1/2012 | Bobok et al. |
| 8,639,487 B1 * | 1/2014 | Ezer ............... G06F 17/505 703/13 |
| 2001/0056461 A1 | 12/2001 | Kampe et al. |
| 2002/0019969 A1 | 2/2002 | Hellerstrand et al. |
| 2002/0032559 A1 | 3/2002 | Hellerstrand et al. |
| 2002/0046391 A1 | 4/2002 | Ito et al. |
| 2002/0049576 A1 | 4/2002 | Meyer |
| 2002/0073375 A1 | 6/2002 | Hollander |
| 2002/0120922 A1 | 8/2002 | Williams et al. |
| 2002/0123874 A1 | 9/2002 | Roesner et al. |
| 2002/0128809 A1 | 9/2002 | Roesner et al. |
| 2002/0129333 A1 | 9/2002 | Chandhoke et al. |
| 2002/0138244 A1 | 9/2002 | Meyer |
| 2002/0152060 A1 | 10/2002 | Tseng |
| 2003/0005416 A1 | 1/2003 | Henftling et al. |
| 2003/0018945 A1 | 1/2003 | Foster et al. |
| 2003/0035375 A1 | 2/2003 | Freeman |
| 2003/0037222 A1 | 2/2003 | Emberson et al. |
| 2003/0093254 A1 | 5/2003 | Frankel et al. |
| 2003/0101039 A1 | 5/2003 | Gabele et al. |
| 2003/0121011 A1 | 6/2003 | Carter |
| 2003/0131325 A1 | 7/2003 | Schubert et al. |
| 2003/0135838 A1 | 7/2003 | Biswal |
| 2003/0144828 A1 | 7/2003 | Lin |
| 2003/0188299 A1 | 10/2003 | Broughton et al. |
| 2003/0191869 A1 | 10/2003 | Williams et al. |
| 2003/0192023 A1 | 10/2003 | Murphy |
| 2003/0192032 A1 | 10/2003 | Andrade et al. |
| 2005/0102125 A1 | 5/2005 | Tseng |
| 2005/0125754 A1 | 6/2005 | Schubert et al. |
| 2005/0137840 A1 | 6/2005 | Peck et al. |
| 2006/0195822 A1 | 8/2006 | Beardslee et al. |
| 2007/0061121 A1 | 3/2007 | Bobok et al. |
| 2007/0067150 A1 | 3/2007 | Mussellman |
| 2007/0260441 A1 | 11/2007 | Bobok et al. |
| 2007/0260443 A1 | 11/2007 | Bobok et al. |
| 2008/0168057 A1 | 7/2008 | Gabele et al. |
| 2008/0183458 A1 | 7/2008 | Bobok et al. |
| 2008/0195368 A1 | 8/2008 | Bobok et al. |
| 2008/0249758 A1 | 10/2008 | Gabele et al. |
| 2008/0281571 A1 | 11/2008 | Boesner et al. |
| 2008/0288234 A1 | 11/2008 | Nelson et al. |
| 2008/0294413 A1 | 11/2008 | Bobok et al. |
| 2009/0112552 A1 | 4/2009 | Behm et al. |
| 2009/0112561 A1 | 4/2009 | Behm et al. |
| 2009/0192778 A1 | 7/2009 | Gabele et al. |
| 2010/0153083 A1 | 6/2010 | Bobok et al. |

OTHER PUBLICATIONS

Altera Corporation; "FFT Co-Processor Reference Design"; AN-363-1.1; Oct. 2004; Version 1.0; Application Note 363; 21 pages.

Texas Instruments: "Code Coverage and Multi-event Profiler for Code Composer Studio v2.3 User's Guide" Apr. 2004.

French et al., R.S. A General Method for Compiling Event-Driven Simulations, Proceedings of the 32nd ACM/IEEE Conference on Design Automation, Jan. 1995, pp. 1-6.

IEEE, "Behavioural Languages—Part 1-1: VHDL language reference manual", pp. 1-21.

Simucad Inc., "Silos User's Manual", version 2001.1, 2001, retrieved from the Internet Archive Wayback Machine dated Apr. 7, 2001 from http://web.archive.org/web/20070115032319/www.cs.bilkent.edu.tr/-wili/courses/CS224/ SilosUsersManual.pdf.

Samir Palnitkar, "Verilog HDL", 1996, Sunsoft Press, pp. 1-396.

* cited by examiner

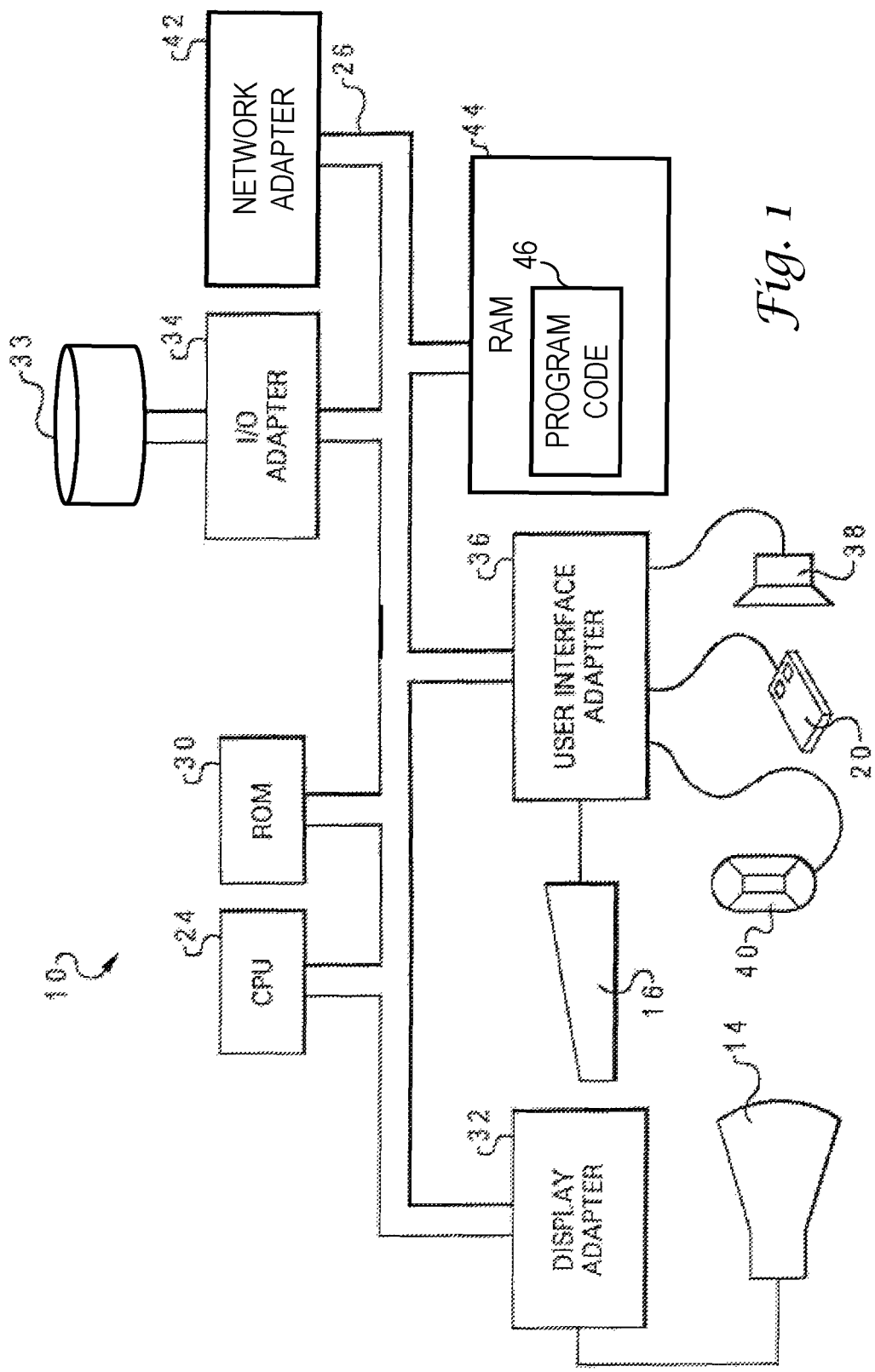

```
ENTITY FXUCHK IS
    PORT(   S_IN    :   IN std_ulogic;
            Q_IN    :   IN std_ulogic;
            R_IN    :   IN std_ulogic;
            clock   :   IN std_ulogic;
            fails   :   OUT std_ulogic_vector(0 to 1);
            counts  :   OUT std_ulogic_vector(0 to 2);
            harvests:   OUT std_ulogic_vector(0 to 1);
        );

452 {   --!! BEGIN
        --!! Design Entity: FXU;

453 {   --!! Inputs
        --!! S_IN    =>    S.C.S;
        --!! Q_IN    =>    A.Q;
        --!! R_IN    =>    R;
        --!! CLOCK   =>    clock;
        --!! End Inputs 454 {   --!! Fail Outputs;
        --!! 0 : "Fail message for failure event 0";
        --!! 1 : "Fail message for failure event 1";
        --!! End Fail Outputs;

455 {   --!! Count Outputs;
        --!! 0 : <event0> clock;
        --!! 1 : <event1> clock;
        --!! 2 : <event2> clock;
        --!! End Count Outputs;

456 {   --!! Harvest Outputs;
        --!! 0 : "Message for harvest event 0";
        --!! 1 : "Message for harvest event 1";
        --!! End Harvest Outputs;

457 {   --!! End;

ARCHITECTURE example of FXUCHK IS
BEGIN
    ... HDL code for entity body section ...    458
END;
```

*Fig. 3C*

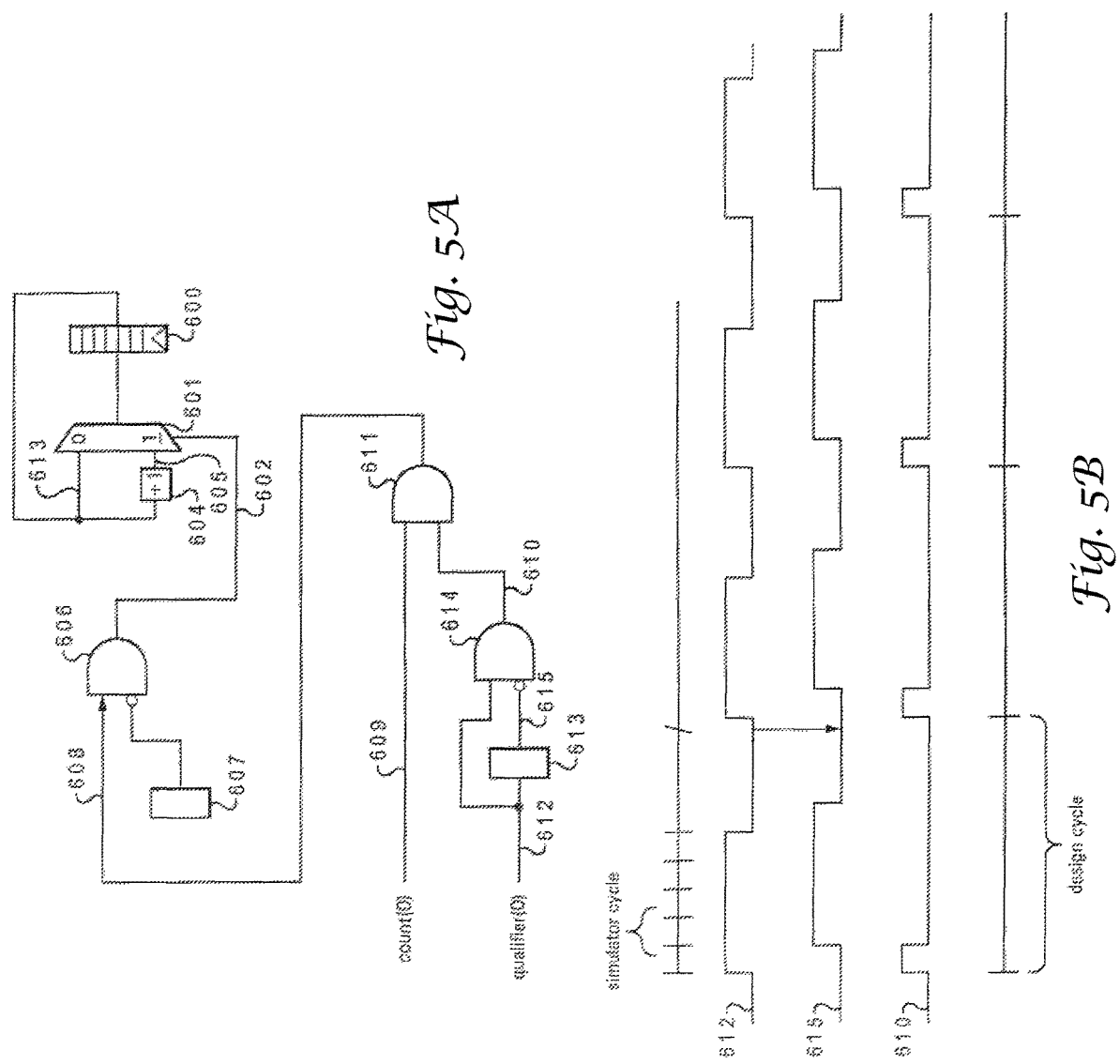

```
ENTITY FSM IS
    PORT(
            ...ports for entity fsm....
        );
    ARCHITECTURE FSM OF FSM IS
    BEGIN
            ... HDL code for FSM and rest of the entity ...
            fsm_state(0 to 2) <= ... Signal 801 ...
853 {   --!! Embedded FSM  : examplefsm;
859 {   --!! clock          : (fsm_clock);
854 {   --!! state_vector   : (fsm_state(0 to 2));
855 {   --!! states         : (S0, S1, S2, S3, S4);
856 {   --!! state_encoding : ('000', '001', '010', '011', '100');
        --!! arcs           : (S0 => S0, S0 => S1, S0 => S2,
857 {   --!!                   (S1 => S2, S1 => S3, S2 => S2,
        --!!                   (S2 => S3, S3 => S4, S4 => S0);
858 {   --!! End FSM;
            ,
            ,
            ,
            ,
            ,
            ,
    END;
```

*Fig. 6C*

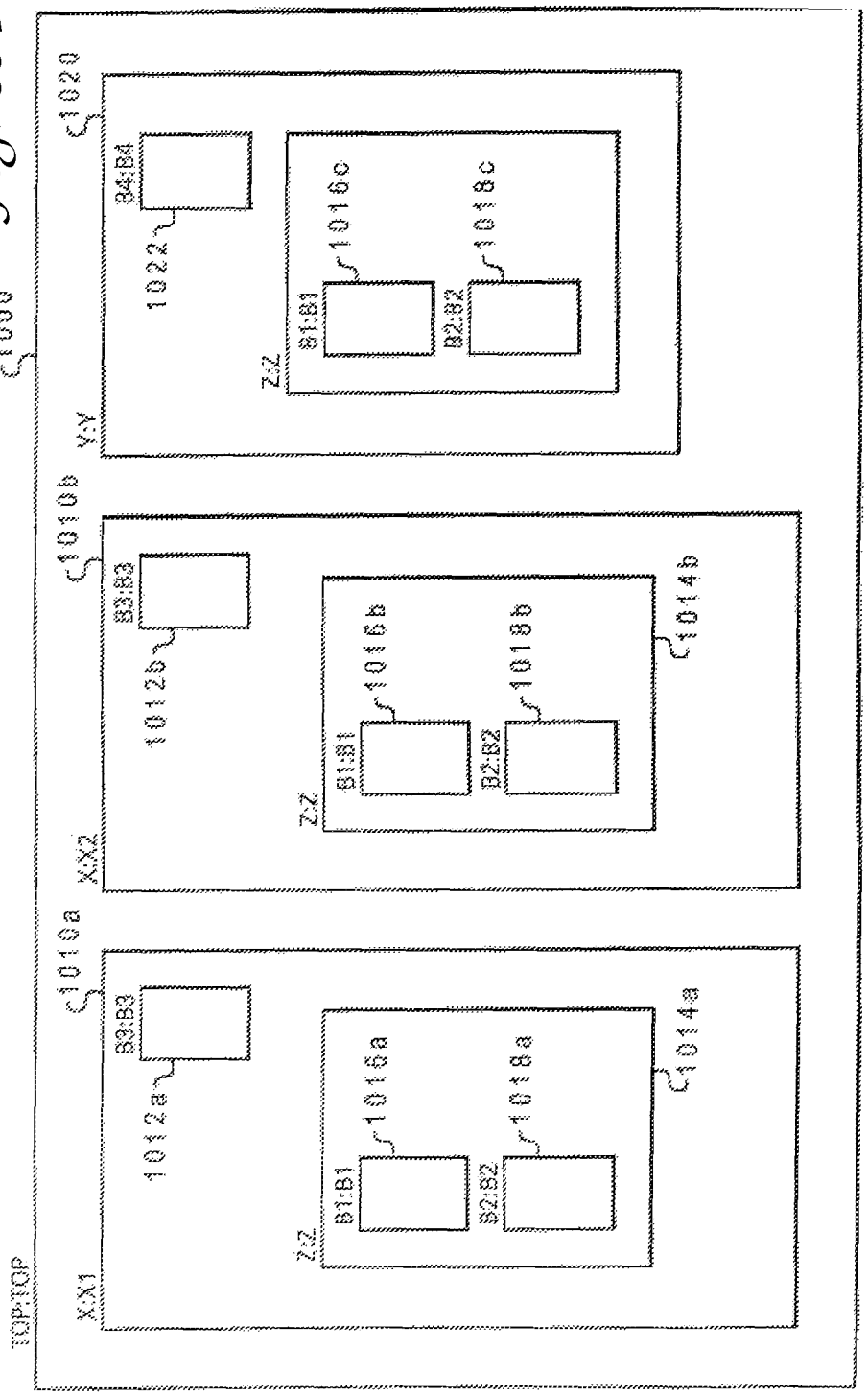

<instantiation identifier>.<instrumentation entity name>.<design entity name> ~1034

Fig. 8B

| 1030 | 1032 | 1034 | 1036 | |
|---|---|---|---|---|
| X1 | B3 | X | COUNT1 | ~1040 |
| X1.Z | B1 | Z | COUNT1 | ~1041 |
| X1.Z | B2 | Z | COUNT1 | ~1042 |
| X2 | B3 | X | COUNT1 | ~1043 |
| X2.Z | B1 | Z | COUNT1 | ~1044 |
| X2.Z | B2 | Z | COUNT1 | ~1045 |
| Y | B4 | Y | COUNT1 | ~1046 |
| Y.Z | B1 | Z | COUNT1 | ~1047 |
| Y.Z | B2 | Z | COUNT1 | ~1048 |

Fig. 8C

<instantiation identifier>.<design entity name>.<eventname>

Fig. 8D

```
-- Inputs
--! event_1108_in <= C.[B2.count.event_1108];
--! event_1124_in <= A.B.[B1.count.event_1124];
--! End Inputs
```

Fig. 9B

```
-- Inputs
--! event_1108_in <= C.[count.event_1108];
--! event_1124_in <= B.[count.event_1124];
--! End Inputs
```

Fig. 9C

```
ENTITY X IS
    PORT( ;
          :
          :
         );

ARCHITECTURE example of X IS

BEGIN
    .
    .
    .
    ... HDL code for X ...
    .
    .
    .

1221 {  Y:Y
        PORT MAP( :
                  :
                 );

1222 {  A <= ....
        B <= ....
        C <= ....
                                      ⌐1230
1229 {  --!! [count, countname0, clock] <= Y.P;      ⌐1232
        --!! Q <= Y.[B1.count.count1] AND A;         ⌐1234
        --!! [fail, failname0, "fail msg"] <= Q XOR B;
        --!! [harvest, harvestname0, "harvest msg"] <= B AND C;
END;                                    ⌐1236
```

SIMULATION EMPLOYING LEVEL-DEPENDENT MULTITYPE EVENTS

BACKGROUND OF THE INVENTION

The present application relates in general to designing and simulating digital devices, modules and systems, and in particular, to simulation of digital devices, modules and systems utilizing a hardware description language (HDL) model. More particularly, the present application relates to simulation that employs level-dependent multitype events.

Verifying the logical correctness of a digital design and debugging the design, if necessary, are very important steps in most digital design processes. Logic networks are tested either by actually building networks or by simulating networks on a computer. As logic networks become highly complex, it becomes necessary to simulate a design before the design is actually built. This is especially true when the design is implemented as an integrated circuit, since the fabrication of integrated circuits requires considerable time and correction of mistakes is quite costly. The goal of digital design simulation is the verification of the logical correctness of the design.

In a typical automated design process that is supported by a conventional electronic computer-aided design (ECAD) system, a designer enters a high-level description utilizing a hardware description language (HDL), such as VHDL, producing a representation of the various circuit blocks and their interconnections. The ECAD system compiles the design description into a format that is best suited for simulation. A simulator is then utilized to verify the logical correctness of the design prior to developing a circuit layout.

A simulator is typically a software tool that operates on a digital representation, or simulation model of a circuit, and a list of input stimuli (i.e., testcase) representing inputs of the digital system. A simulator generates a numerical representation of the response of the circuit, which may then either be viewed on the display screen as a list of values or further interpreted, often by a separate software program, and presented on the display screen in graphical form. The simulator may be run either on a general-purpose computer or on another piece of electronic apparatus, typically attached to a general purpose computer, specially designed for simulation. Simulators that run entirely in software on a general-purpose computer will hereinafter be referred to as "software simulators". Simulators that are run with the assistance of specially designed electronic apparatus will hereinafter be referred to as "hardware simulators".

Usually, software simulators perform a very large number of calculations and operate slowly from the user's point of view. In order to optimize performance, the format of the simulation model is designed for very efficient use by the simulator. Hardware simulators, by nature, require that the simulation model comprising the circuit description be communicated in a specially designed format. In either case, a translation from an HDL description to a simulation format, hereinafter referred to as a simulation executable model, is required.

BRIEF SUMMARY

In at least one embodiment, a processor of a data processing system creates level qualifying logic within instrumentation of a hardware description language (HDL) simulation model of a design. The level qualifying logic is configured to generate a first event of a first type for a first simulation level and to generate a second event of second type for a second simulation level. The processor simulates the design utilizing the HDL simulation model, where the simulation includes generating the first event of the first type responsive to the simulating being performed at the first simulation level and generating the second event of the second type responsive to the simulating being performed at the second simulation level. Responsive to the simulating, the processor records, within data storage, at least one occurrence of an event from a set including the first event and the second event.

BRIEF DESCRIPTION OF THE SEVERAL VIEWS OF THE DRAWINGS

FIG. 1 depicts an exemplary data processing system in accordance with one or more embodiments;

FIG. 3C illustrates exemplary sections of HDL syntax that maybe utilized in accordance one or more embodiments;

FIG. 5A is a simplified gate level representation of an exemplary counting instrument with a runtime disable feature and automatic clocking adjustment in accordance one or more embodiments;

FIG. 5B is a simplified timing diagram illustrating automatic clocking adjustment of counting instrumentation;

FIG. 6C illustrates a hardware description language file including embedded instrumentation in accordance one or more embodiments;

FIG. 8A is a block diagram illustrating a simulation model containing a number of design and instrumentation entities;

FIG. 8B depicts a data structure for declaring an event within a simulation model in accordance with one or more embodiments;

FIG. 8C illustrates a list of extended event data structures for the simulation model in FIG. 9A;

FIG. 8D depicts a data structure for declaring an event within a simulation model in accordance with an alternate embodiment;

FIG. 9B depicts a set of input port mapping comments for performing hierarchical processing of simulation model events in accordance with a first embodiment;

FIG. 9C illustrates a set of input port mapping comments for performing hierarchical processing of simulation model events in accordance with a second embodiment;

FIG. 10B illustrates an exemplary HDL file for implementing instrumentation logic within an HDL design entity in accordance one or more embodiments;

DETAILED DESCRIPTION

Figure 2A:
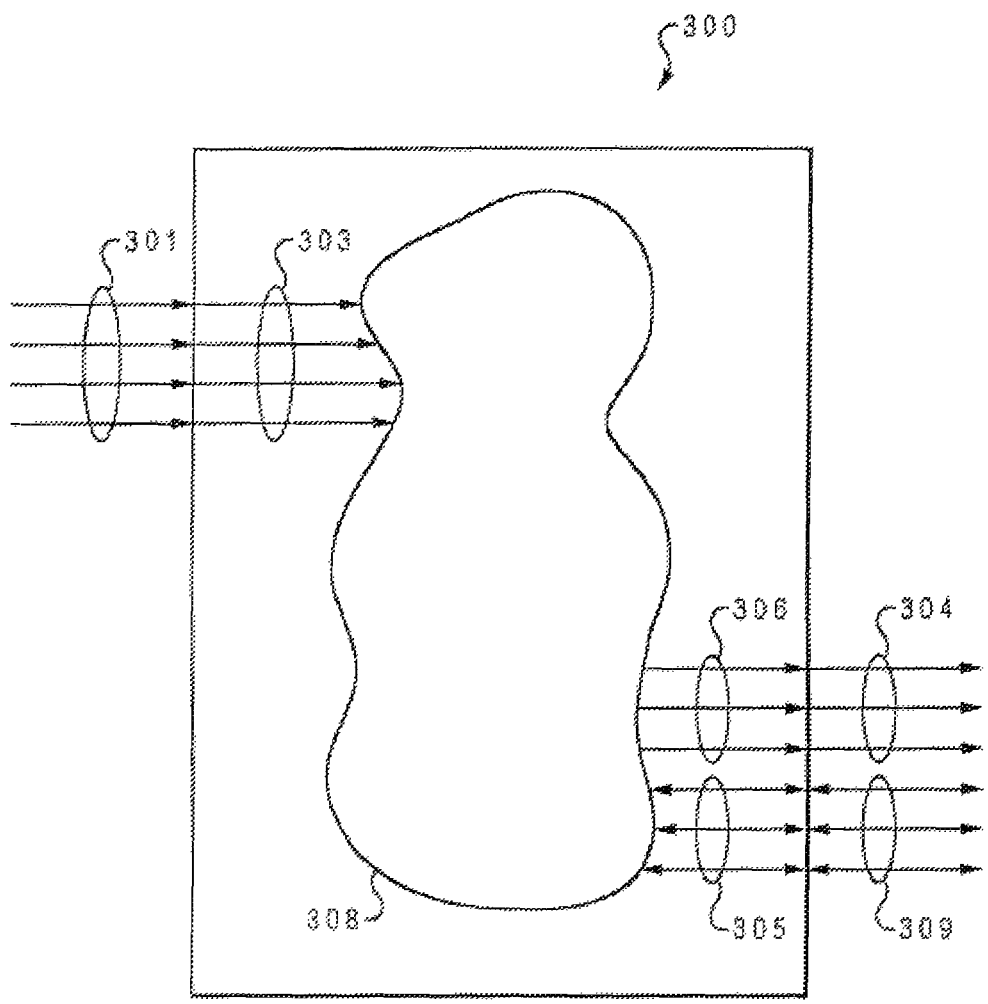
FIG. 2A is a simplified block diagram illustrating a digital design entity that may be instrumented in accordance with one or more embodiments.

The present application provides for accurate and comprehensive monitoring of a digital circuit design in which a designer creates instrumentation modules preferably utilizing the same hardware description language (HDL) as utilized for the design itself. HDLs, while suited to the needs of digital designers, can also be effectively utilized for a number of checking functions. In accordance with one or more embodiments, instrumentation modules are utilized to monitor specified design parameters while not becoming compiled as an integral part of the design itself. Furthermore, since the instrumentation modules can be written in the same HDL as utilized for the actual design, such modules are platform and simulator independent. Unlike checking done with C or C++ programs, HDL instrumentation can be compiled and run directly without loss of performance on hardware simulators.

With reference now to the figures, and in particular with reference to FIG. 1, there is depicted a representative data processing system 10 that may be utilized for simulation of a digital circuit design. Data processing system 10 includes one or more processors 24 and a number of other units interconnected via system interconnect 26, which may include one or more buses, switches and/or bridges.

Data processing system 10 further includes memory, such as flash memory (not explicitly illustrated), a random-access memory (RAM) 44 and/or read-only memory (ROM) 30. As shown with respect to RAM 44, the memory stores program code 46 (including program instructions) that is processed by processor(s) 24 to cause data processing system 10 to perform the operations described herein.

Data processing system 10 additionally includes a display adapter 32 for connecting system bus 26 to a display device 14, and an I/O adapter 34 for connecting peripheral devices (e.g., storage drives 33) to system interconnect 26. In addition, data processing system 10 includes an interface adapter 36 for connecting keyboard 16, mouse 20, speaker 38, microphone 40, and/or other user interface devices, such as a touch-screen device (not shown), to system interconnect 26.

Those skilled in the art will appreciate that the generalized hardware environment depicted in FIG. 1 may vary for specific design and simulation applications. Consequently, the claims should not be limited by the generalized computer architecture illustrated in FIG. 1.

Simulated digital circuit design models are comprised of at least one, and usually many, sub-units referred to hereinafter as design entities. FIG. 2A is a block diagram representation of an exemplary design entity 300 in accordance with one or more embodiments. Design entity 300 is defined by a number of components: an entity name, entity ports, and a representation of the function performed by design entity 300. Each entity within a given model has a unique name (not explicitly shown in FIG. 2A) that is declared in the HDL description of each entity. Furthermore, each entity typically contains a number of signal interconnections, known as ports, to signals outside the entity. These outside signals may be primary input/outputs (I/Os) of an overall design or signals connecting to other entities within an overall design.

Typically, ports are categorized as belonging to one of three distinct types: input ports, output ports, and bi-directional ports. Design entity 300 is depicted in as having a number of input ports 303 that convey signals into design entity 300. Input ports 303 are connected to input signals 301. In addition, design entity 300 includes a number of output ports 306 that convey signals out of design entity 300. Output ports 306 are connected to a set of output signals 304. Bi-directional ports 305 are utilized to convey signals into and out of design entity 300. Bi-directional ports 305 are in turn connected to a set of bi-directional signals 309. An entity, such as design entity 300, need not contain ports of all three types, and in the degenerate case, contains no ports at all. To accomplish the connection of entity ports to external signals, a mapping technique, known as a "port map", is utilized. A port map (not explicitly depicted in FIG. 2A) provides a specified correspondence between entity port names and external signals to which the entity is connected. When building a simulation model, ECAD software is utilized to connect external signals to appropriate ports of the entity according to a port map specification.

Finally, design entity 300 contains a body section 308 that describes one or more functions performed by design entity 300. In the case of a digital design, body section 308 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Figure 2B:
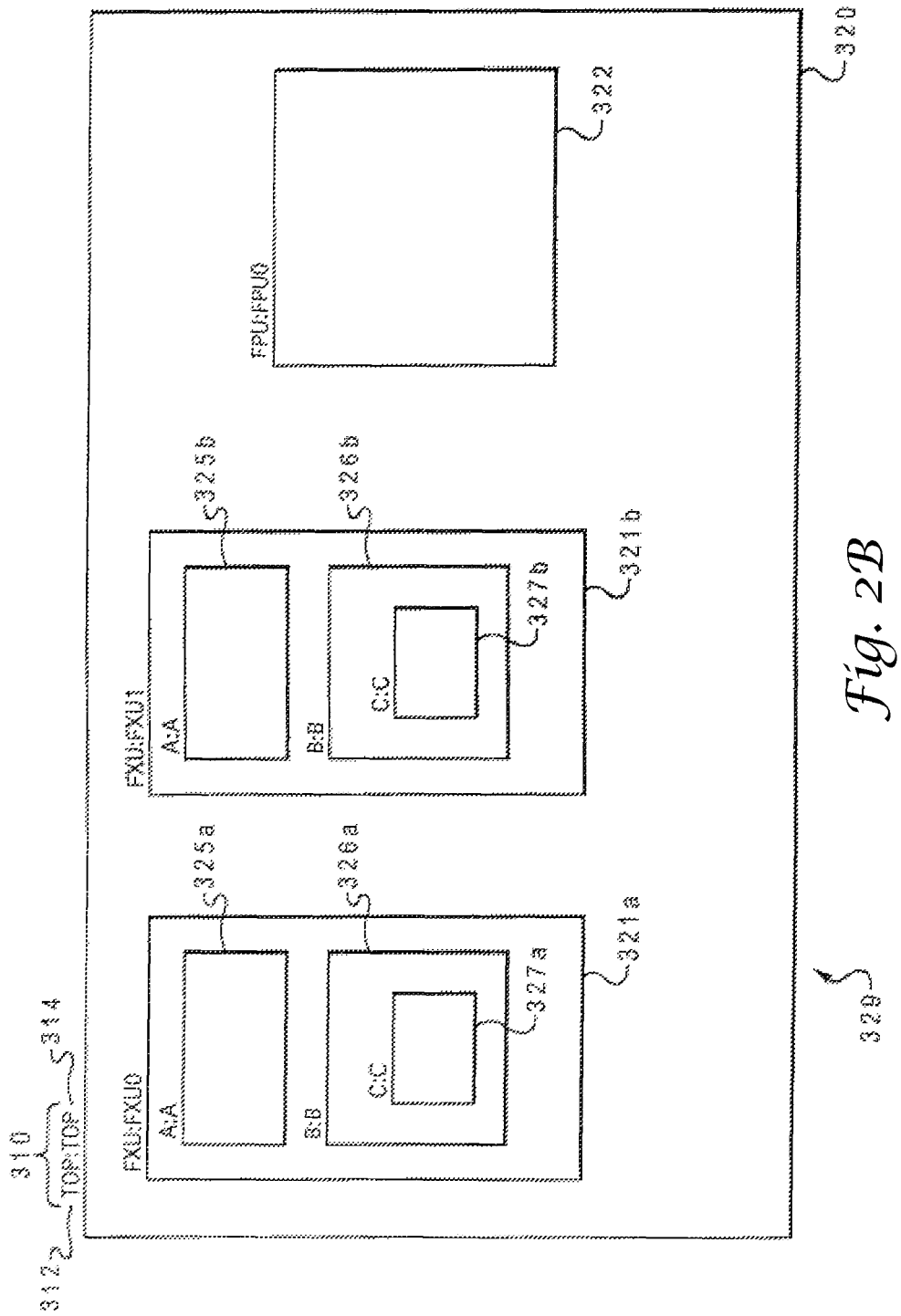
FIG. 2B is a diagrammatic representation depicting a simulation model that may be instrumented in accordance one or more embodiments.

Referring now to FIG. 2B, there is illustrated a diagrammatic representation of an exemplary simulation model 329 that may be utilized in one or more embodiments. Simulation model 329 includes multiple hierarchical entities. For visual simplicity and clarity, the ports and signals interconnecting the entities within simulation model 329 have not been explicitly shown. In any model, one and only one entity is the so-called "top-level entity". A top-level entity 320 is that entity which encompasses all other entities within simulation model 329. That is to say, top-level entity 320 instantiates, either directly or indirectly, all descendant entities within a design. Simulation model 329 includes a top-level entity 320 that directly instantiates two instances, 321a and 321b, of an FXU entity 321 and a single instance of an FPU entity 322. Each instantiation has an associated description, which contains an entity name and a unique instantiation name. For top-level entity 320, description 310 is labeled "TOP:TOP". Description 310 includes an entity name 312, labeled as the "TOP" preceding the colon, and also includes an instantiation name 314, labeled as the "TOP" following the colon.

It is possible for a particular entity to be instantiated multiple times as is depicted with instantiations 321a and 321b of FXU entity 321. Instantiations 321a and 321b are distinct instantiations of FXU entity 321 with instantiation names FXU0 and FXU1 respectively. Top-level entity 320 is at the highest level within the hierarchy of simulation model 329. An entity that instantiates a descendant entity will be referred to hereinafter as an "ancestor" of the descendant entity. Top-level entity 320 is therefore the ancestor that directly instantiates FXU entity instantiations 321a and 321b. At any given level of a simulation model hierarchy, the instantiation names of all instantiations must be unique.

In addition to FXU entity instantiations 321a and 321b, top-level entity 320 directly instantiates a single instance of a FPU entity 322 having an entity name FPU and instantiation name FPU0. Within an entity description, it is common for the entity name to match the instantiation name when only one instance of that particular entity is placed at a given level of a simulation model hierarchy. However, this is not required as shown by entity 322 (instantiation name FPU0, entity name FPU).

Within instantiation 321a of FXU entity 321, single instance entities 325a and 326a of entity A 325 and entity B 326 respectively, are directly instantiated. Similarly, instantiation 321b of the same FXU entity contains instantiations 325b and 326b of entity A 325 and entity B 326 respectively. In a similar manner, instantiation 326a and instantiation 326b each directly instantiate a single instance of entity C 327 as entities 327a and 327b respectively. The nesting of entities within other entities can continue to an arbitrary level of complexity provided that all entities instantiated, whether singly or multiply, have unique entity names and the instantiation names at any given level of the hierarchy are unique with respect to one another. Each entity is constructed from one or more HDL files that contain the information necessary to describe the entity.

Associated with each entity instantiation is a so called "instantiation identifier". The instantiation identifier for a given instantiation is a string including the enclosing entity instantiation names proceeding from the top-level entity instantiation name. For example, the instantiation identifier of instantiation 327a of entity C 327 within instantiation 321a of FXU entity 321 is "TOP.FXU0.B.C". This identifier serves to uniquely identify each instantiation within a simulation model.

Figure 2C:
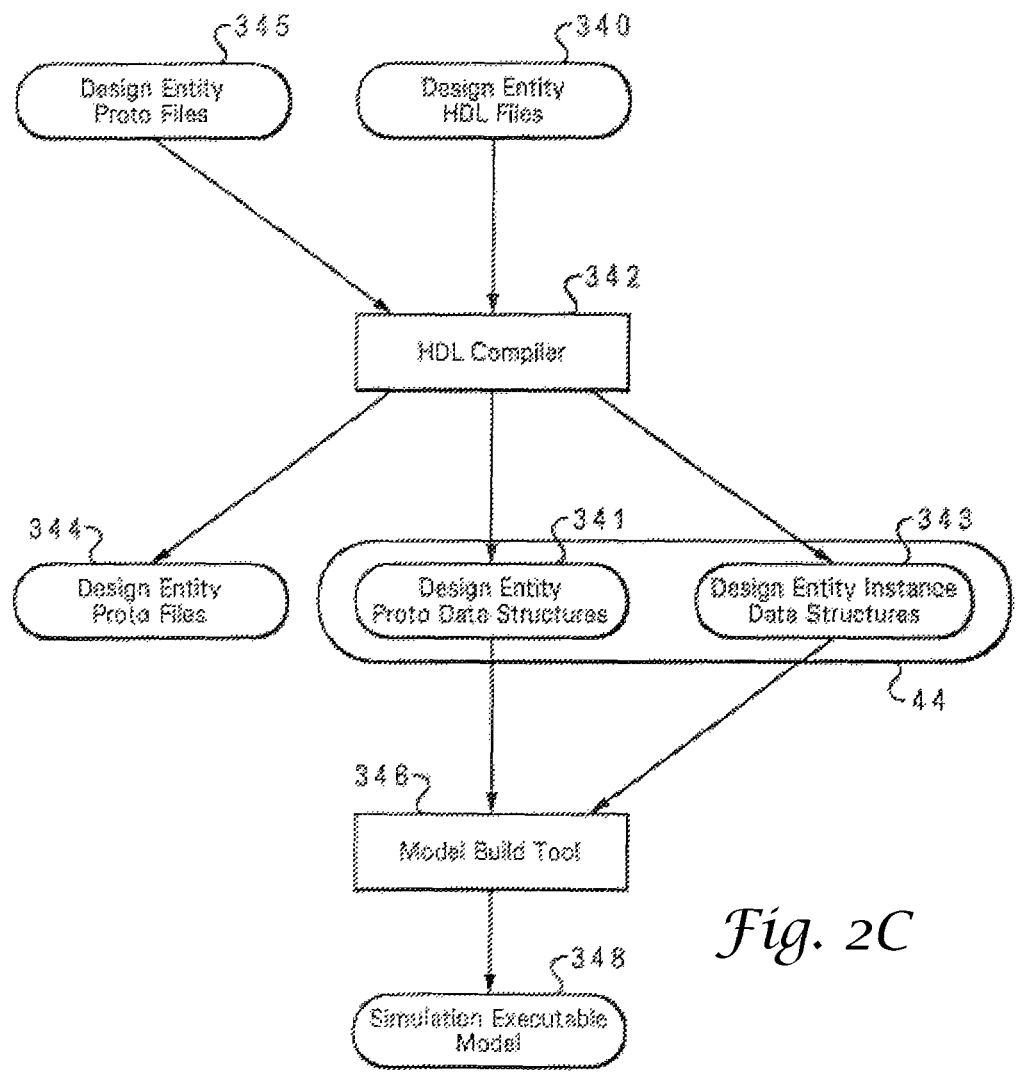
FIG. 2C is a flow diagram illustrating of a model build process that may be implemented in accordance one or more embodiments.

Referring now to FIG. 2C, there is depicted a flow diagram of a model build process in accordance with one or more embodiments. The process begins with one or more design entity HDL source code files 340 and, potentially, one or more design entity intermediate format files 345, hereinafter referred to as "proto files" 345, available from a previous run of an HDL compiler 342. HDL compiler 342 processes HDL file(s) 340 beginning with the top level entity of a simulation model and proceeding in a recursive fashion through all HDL or proto file(s) describing a complete simulation model. For each of HDL files 340 during the compilation process, HDL compiler 342, examines proto files 345 to determine if a previously compiled proto file is available and consistent. If such a file is available and consistent, HDL compiler 342 will not recompile that particular file, but will rather refer to an extant proto file. If no such proto file is available or the proto file is not consistent, HDL compiler 342 explicitly recompiles the HDL file 340 in question and creates a proto file 344, for use in subsequent compilations. Such a process will be referred to hereinafter as "incremental compilation" and can greatly speed the process of creating a simulation executable model 348. Incremental compilation is described in further detail herein below. Once created by HDL compiler 342, Proto files 344 are available to serve as proto files 345 in subsequent compilations.

In addition to proto files 344, HDL compiler 342 also creates two sets of data structures, design entity proto data structures 341 and design entity instance data structures 343, in memory 44 of computer system 10. Design entity proto data structures 341 and design entity instance data structures 343, serve as a memory image of the contents of a simulation executable model 348. Data structures 341 and 343 are passed, via memory 44, to a model build tool 346 that processes data structures 341 and 343 into simulation executable model 348.

It will be assumed hereinafter that each entity is described by a single HDL file. Depending on convention or the particular HDL that is utilized, this restriction may be required. However, in certain circumstances or for certain HDLs it is possible to describe an entity by utilizing more than one HDL file. Those skilled in the art will appreciate and understand the extensions necessary if entities are permitted to be described by multiple HDL files. Furthermore, it will be assumed that there is a direct correspondence, for each entity, between the entity name and both of the following: the name of the HDL file representing the entity, and the name of the proto file for the entity.

In the following description, an HDL source code file corresponding to a given entity will be referred to by an entity name followed by ".vhdl". For example, the HDL source code file that describes top-level entity 320 will be referred to as TOP.vhdl. This labeling convention serves as a notational convenience only and should not be construed as limiting the applicability of the present disclosure to HDLs other than VHDL.

Returning to FIG. 2B, it can be seen that each entity may instantiate, either directly or indirectly, one or more other entities. For example, the FXU entity directly instantiates A entity 325 and B entity 326. Furthermore, B entity 326 directly instantiates C entity 327. Therefore, FXU entity 321 instantiates, directly or indirectly, A entity 325, B entity 326 and C entity 327. Those entities, that are directly or indirectly instantiated by another entity, will be referred to hereinafter as "descendants." The descendants of top level entity 320 are FXU entity 321, FPU entity 322, A entity 325, B entity 326, and C entity 327. It can be seen that each entity has a unique set of descendants and that each time an entity is instantiated, a unique instance of the entity and its descendants is created. Within simulation model 329, FXU entity 321 is instantiated twice, FXU:FXU0 321a and FXU:FXU1 321b, by top-level entity 320. Each instantiation of FXU entity 321 creates a unique set of instances of the FXU, A, B, and C entities.

For each entity, it is possible to define what is referred to as a "bill-of-materials" or BOM. A BOM is a list of HDL files having date and time stamps of the entity itself and the entity's descendants. Referring again to FIG. 2C, the BOM for an entity is stored in proto file 344 after compilation of the entity. Therefore, when HDL compiler 342 compiles a particular HDL source code file among HDL files 340, a proto file 344 is generated that includes a BOM listing the HDL files 340 that constitute the entity and the entity's descendants, if any. The BOM also contains the date and time stamp for each of the HDL files referenced as each appeared on disk/tape 33 of computer system 10 when the HDL file was being compiled.

If any of the HDL files constituting an entity or the entity's descendants is subsequently changed, proto file 344 will be flagged as inconsistent and HDL compiler 342 will recompile HDL file 340 on a subsequent re-compilation as will be described in further detail below. For example, going back to FIG. 2B, the HDL files referenced by the BOM of FXU entity 321 are FXU.vhdl, A.vhdl, B.vhdl and C.vhdl, each with appropriate date and time stamps. The files referenced by the BOM of top-level entity 320 are TOP.vhdl, FXU.vhdl, A.vhdl, B.vhdl, C.vhdl, and FPU.vhdl with appropriate date and time stamps.

Returning to FIG. 2C, HDL compiler 342 creates an image of the structure of a simulation model in main memory 44 of computer system 10. This memory image is comprised of the following components: "proto" data structures 341 and "instance" data structures 343. A proto is a data structure that, for each entity in the model, contains information about the ports of the entity, the body contents of the entity, and a list of references to other entities directly instantiated by the entity (in what follows, the term "proto" will be utilized to refer to the in-memory data structure described above and the term "proto file" will be utilized to describe intermediate format file(s) 344). Proto files 344 are therefore on-disk representations of the in-memory proto data structure produced by HDL compiler 342.

An instance data structure is a data structure that, for each instance of an entity within a model, contains the instance name for the instance, the name of the entity the instance refers to, and the port map information necessary to interconnect the entity with external signals. During compilation, each entity will have only one proto data structure, while, in the case of multiple instantiations of an entity, each entity may have one or more instance data structures.

In order to incrementally compile a model efficiently, HDL compiler 342 follows a recursive method of compilation in which successive entities of the model are considered and loaded from proto files 345 if such files are available and are consistent with the HDL source files constituting those entities and their descendants. For each entity that cannot be loaded from existing proto files 345, HDL compiler 342 recursively examines the descendants of the entity, loads those descendant entities available from proto file(s) 345 and creates, as needed, proto files 344 for those descendants that are inconsistent with proto files 345. Pseudocode for the main control loop of HDL compiler 342 is shown below (the line numbers to the right of the pseudocode are not a part of the pseudocode, but merely serve as a notational convenience).

```
process_HDL_file(file)                              5
{                                                   10
    if (NOT proto_loaded(file)) {                   15
        if (exists_proto_file(file) AND check_bom(file)) {  20
            load_proto(file);                       25
        } else {                                    30
            parse_HDL_file(file)                    35
```

```
        for (all instances in file) {               40
            process_HDL_file(instance);             45
        }                                           50
        create_proto(file);                         55
        write_proto_file(file);                     60
    }                                               65
}                                                   70
create_instance(file):                              75
}                                                   80
```

When compiler 342 is initially invoked, no proto data structures 341 or instance data structures 343 are present in memory 44 of computer system 10. The main control loop, routine process_HDL_file( )(line 5), is invoked and passed the name of the top level entity by means of parameter "file". The algorithm first determines if a proto data structure for the current entity is present in memory 44 by means of routine proto_loaded( )(line 15). Note that the proto data structure for the top level entity will never be present in memory because the process starts without any proto data structures loaded into memory 44. If a matching proto data structure is present in memory 44, instance data structures for the current entity and the current entity's descendants, if any, are created as necessary in memory 44 by routine create_instance( )(line 75).

However, if a matching proto data structure is not present in memory 44, control passes to line 20 where routine exists_proto_file( ) examines proto files 345 to determine if a proto file exists for the entity. If and only if a matching proto file exists, routine check_bom( ) is called to determine whether proto file 345 is consistent. In order to determine whether the proto file is consistent, the BOM for the proto file is examined. Routine check_bom( ) examines each HDL source code file listed in the BOM to determine if the date or time stamps for the HDL source code file have changed or if the HDL source code file has been deleted. If either condition occurs for any file in the BOM, the proto file is inconsistent and routine check_bom( ) fails. However, if check_bom( ) is successful, control is passed to line 25 where routine load_proto( ) loads the proto file and any descendant proto files into memory 44, thus creating proto data structures 341 for the current entity and the current entity's descendants, if any. The construction of process_HDL_file( ) ensures that once a proto file has been verified as consistent, all of its descendant proto files, if any, are also consistent.

If the proto file is either non-existent or is not consistent, control passes to line 35 where routine parse_HDL_file( ) loads the HDL source code file for the current entity. Routine parse_HDL_file( )(line 35) examines the HDL source code file for syntactic correctness and determines which descendant entities, if any, are instantiated by the current entity. Lines 40, 45, and 50 constitute a loop in which the routine process_HDL_file( ) is recursively called to process the descendent entities that are called by the current entity. This process repeats recursively traversing all the descendants of the current entity in a depth-first fashion creating proto data structures 341 and proto data files 344 of all descendants of the current entity. Once the descendant entities are processed, control passes to line 55 where a new proto data structure is created for the current entity in memory 44 by routine create_proto( ). Control then passes to line 60 where a new proto file 344, including an associated BOM, is written to disk 33 by routine write_proto_file( ). Finally, control passes to line 75 where routine create_instance( ) creates instance data structures 343 for the current entity and any descendant entities as necessary. In this manner, process_HDL_file( )(line 5) recursively processes the entire simulation model creating an in-memory image of the model including proto data structures 341 and instance data structures 343.

Figure 2D:
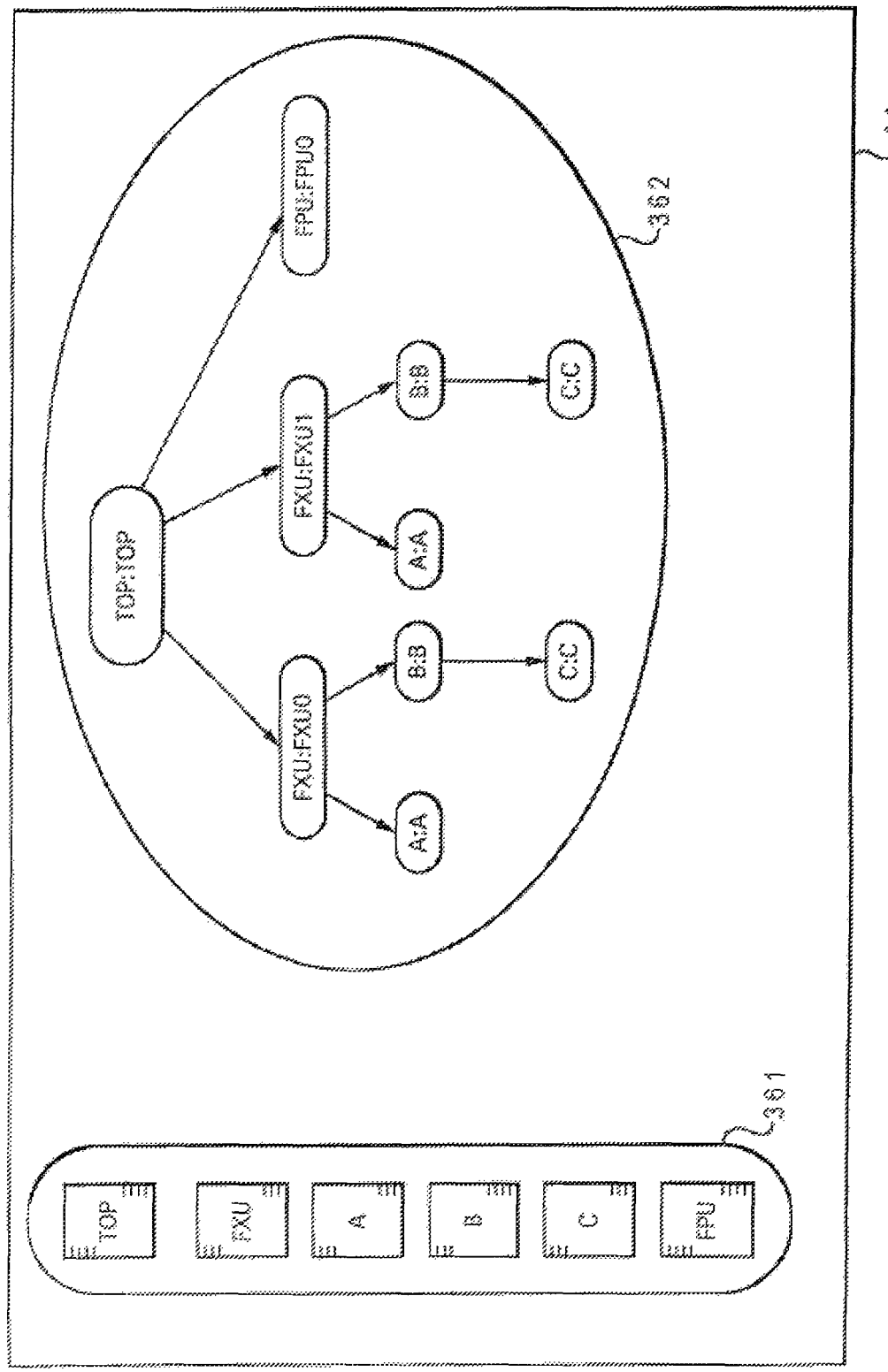
FIG. 2D is a block diagram depicting data structures that may be instrumented in accordance one or more embodiments.

With reference now to FIG. 2D there is depicted a block diagram representing compiled data structures in accordance with one or more embodiments. Memory 44 contains proto data structures 361, one for each of the entities referred to in simulation model 329. In addition, instantiations in simulation model 329 are represented by instance data structures 362. Instance data structures 362 are connected by means of pointers indicating the hierarchical nature of the instantiations of the entities within simulation model 329. Model build tool 346 in FIG. 2C processes the contents of memory 44 into memory data structures in order to produce simulation executable model 348.

In order to instrument simulation models, "instrumentation entities," which are in contrast to the entities constituting a design (referred to herein as "design entities"), are utilized. As with design entities, instrumentation entities are described by one or more HDL source code files and include a number of signal ports, a body section, and an entity name. In what follows, it will be assumed that an instrumentation entity is described by a single HDL file. Those skilled in the art will appreciate and understand extensions necessary to utilize an instrumentation entity that is described by multiple HDL files. Each instrumentation entity is associated with a specific design entity referred to hereinafter as the "target entity."

Figure 3A:
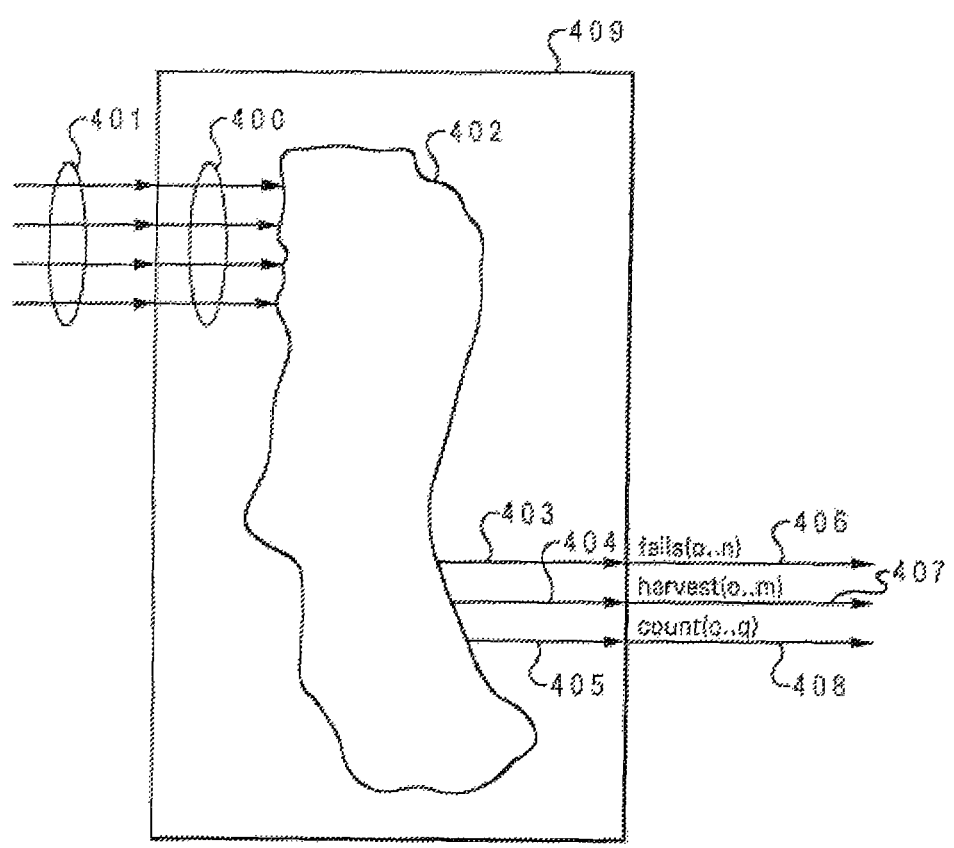
FIG. 3A is a simplified block diagram representative of an instrumentation entity.

With reference now to FIG. 3A, there is illustrated a block diagram representation of an instrumentation entity 409. Instrumentation entity 409 includes a number of input ports 400 that are connected to signals 401 within a target entity (not depicted in FIG. 3A). A body section 402 contains logic necessary to detect occurrences of specified conditions within the target entity and generate simulation model "events" with respect to signals 401. Three distinct types of events may be generated: "count" events, "fail" events, and "harvest" events, each described below in turn. Body section 402 contains internal logic for detecting occurrences of conditions precipitating generation of these events. A set of multi-bit output ports 403, 404, and 405 are connected to external instrumentation logic (depicted in FIG. 3B) by means of external signals 406, 407, and 408. Output ports 403, 404, and 405 thus provide the connection from the internal logic in body section 402 to the external instrumentation logic which is utilized to indicate the occurrence of count, failure and harvest events.

A failure event is a sequence of signal values that indicate a failure in the correct operation of the simulation model. Each instrumentation entity monitors the target entity for any desired number of failure events. Each occurrence of a failure event is assigned to a particular signal bit on output port 403. Logic within body section 402 produces an active high pulse on a specified bit of signal 403 when a failure condition is detected. Such activation of signal 403 is defined as a failure event. This error indication is conveyed by means of external signal 406 to external instrumentation logic (depicted in FIG. 3B as external instrumentation logic block 420), which flags the occurrence of the failure event.

A count event is a sequence of signal values that indicate the occurrence of an event within a simulation model for which it would be advantageous to maintain a count. Count events are utilized to monitor the frequency of occurrence of specific sequences within a simulation model. Each instrumentation entity can monitor the target entity for any desired number of count events. Each count event is assigned to a particular signal bit on output port 405. Logic block 402 contains the logic necessary to detect the occurrence of the desired count events and produces an active high pulse on the specified bit of signal 405 when a count event is detected. This count indication is conveyed by means of external signal 408 to instrumentation logic, which contains counters utilized to record the number of occurrences of each count event.

The third event type, a harvest event, is a sequence of signal values that indicate the occurrence of a specific operative circumstance, which would be advantageous to be able to reproduce. When a harvest event occurs, a register within an external instrumentation logic block is loaded to indicate at what point within a simulation run the event occurred, and a flag is set to indicate the occurrence of the specific circumstance. The details of the simulation run can thus be saved in order to recreate the specific circumstance monitored by the harvest event. Logic block 402 contains the logic necessary to detect the harvest events.

Each instrumentation entity can detect any desired number of harvest events that are each assigned to a particular signal bit on output port 404. Logic within block 402 produces an active high pulse on the specified bit of signal 404 when a harvest event is detected. This harvest event detection is conveyed by means of external signal 407 to external instrumentation logic that contains a register and flag for each harvest event. The register is utilized to record at which point in the simulation run the harvest event occurred, and the flag is utilized to indicate the occurrence.

Figure 3B:
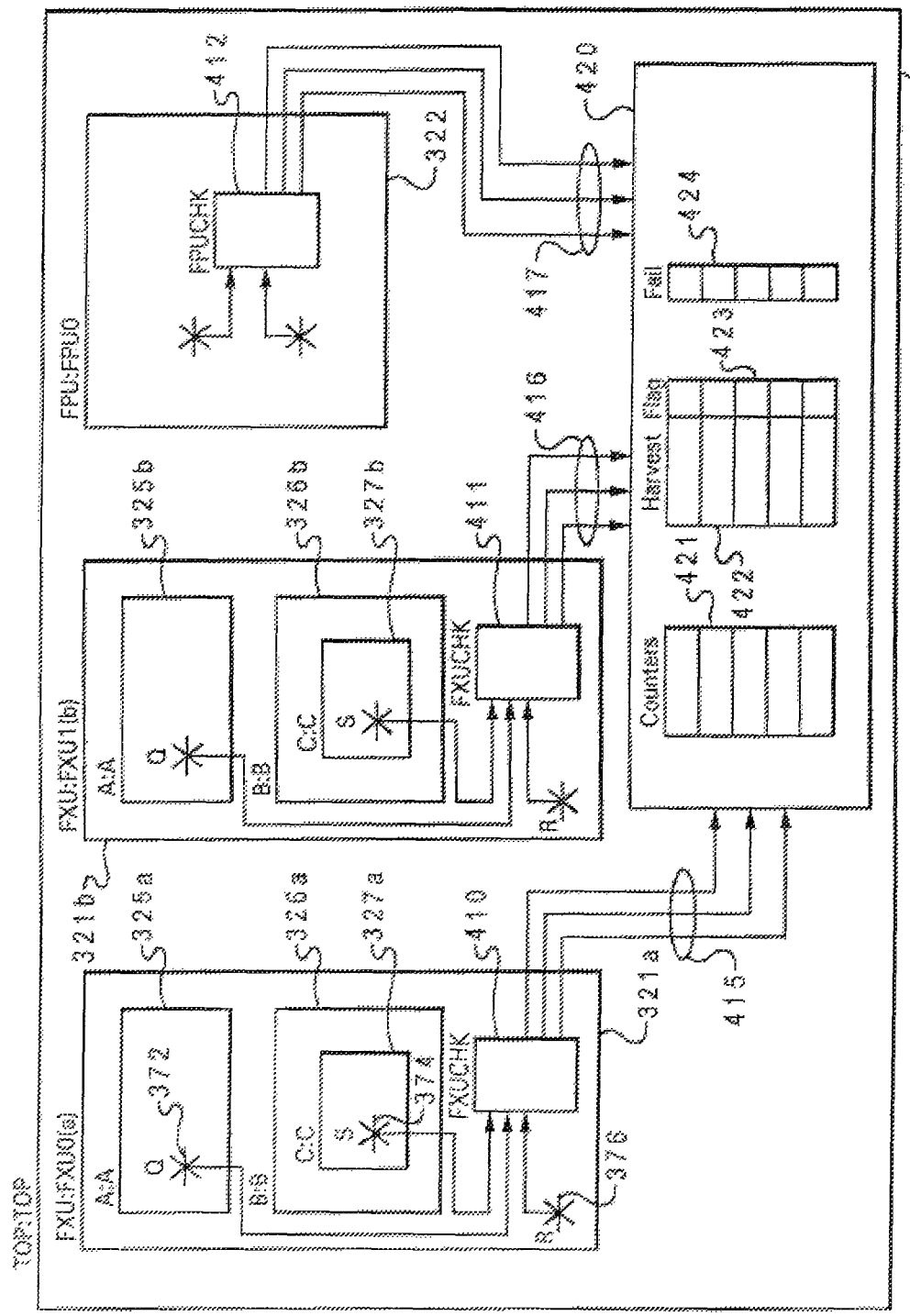
FIG. 3B is a simplified block diagram of a simulation model instrumented in accordance one or more embodiments.

With reference now to FIG. 3B, there is depicted a block diagram representation of simulation model 329 instrumented in accordance one or more embodiments. As can be seen in FIG. 3B, an instance 410 and an instance 411 of an instrumentation entity FXUCHK are utilized to monitor instances 321a and 321b of an FXU entity. For each of FXU instantiations 321a and 321b, an FXUCHK instantiation, 410 and 411 respectively, is automatically generated. In a similar fashion, instrumentation entity FPUCHK 412 is instantiated to monitor FPU entity 322.

As depicted in FIG. 3B, entity FXUCHK monitors a signals Q 372, a signal R 376, and a signal S 374 within each of instances 321a and 321b of the FXU entity. Signal Q 372, is a signal within the instances 325a and 325b of descendant entity A. Likewise, signal S 374 is a signal within descendant entity C that resides within descendant entity B. Finally, signal R 376 occurs directly within FXU entity 321. Although an instrumentation entity may monitor any signal within a target entity or the target entity's descendent entities, signals outside the target entity cannot be monitored.

Each instrumentation entity is connected by means of fail, count, and harvest signals to instrumentation logic block 420 containing logic for recording occurrences of each of the three event types. For the count events monitored in simulation model 329, a set of counters 421 is utilized to count the number of occurrences of each count event. In a similar manner, a set of flags 424 is utilized to record the occurrence of failure events. Finally, a set of counters 422 and flags 423 are combined and utilized to record the point at which a harvest event occurs and its occurrence, respectively. In one or more embodiments, a cycle number is captured and stored utilizing counters 422 and flags 423 to record a harvest event.

To facilitate instantiation and connection of instrumentation entities, instrumentation entity HDL source code files include a specialized comment section, hereinafter referred to as "instrumentation entity description," that indicates the target entity, the signals within the target entity to be monitored, and information specifying types of events to be monitored.

With reference now to FIG. 3C, there is illustrated an exemplary HDL file 440 that describes instrumentation entity FXUCHK depicted in FIG. 3B. HDL file 440 utilizes the syntax of the VHDL hardware description language. In the VHDL language, lines beginning with two dashes ("--") are recognized by a compiler as being comments. In one or more embodiments, comments of a non-conventional form are utilized to indicate information about an instrumentation entity. FIG. 3C depicts one embodiment in which comments begin with two exclamation points in order to distinguish these comments from conventional comments in instrumentation HDL file 440. It will be appreciated by those skilled in the art that the exemplary syntax utilized in FIG. 3C for the provision of unconventional comments is but one of many possible formats.

Within HDL file 440, the I/O ports of a FXUCHK entity are declared in entity declaration 450. Within entity declaration 450, three input ports, S_IN, Q_IN, and R_IN respectively, are declared. Input ports, S_IN, Q_IN, and R_IN, will be attached to signal S, 374, signal Q, 372, and signal R, 376 respectively as described below. Input port, CLOCK, is also declared and will be connected to a signal, CLOCK, within the FXU entity. In addition, three output ports: fails (0 to 1), counts (0 to 2), and harvests (0 to 1), are declared. These output ports provide failure, count, and harvest signals for two failure events, three count events, and two harvest events. The names of the output ports are fixed by convention in order to provide an efficient means for automatically connecting these signals to instrumentation logic block 420.

A set of instrumentation entity descriptors 451 is utilized to provide information about the instrumentation entity. As illustrated in FIG. 3C, descriptor comments 451 may be categorized in a number of distinct sections: prologue and entity name declaration 452, an input port map 453, a set of failure message declarations 454, a set of counter declarations 455, a set of harvest declarations 456, and an epilogue 457.

The prologue and entity name 452 serve to indicate the name of the particular target entity that the instrumentation entity will monitor. Prologue and entity name declaration 452 also serves as an indication that the instrumentation entity description has begun. Specifically, the comment "--!! Begin" within prologue and entity name 452, indicates that the description of an instrumentation entity has begun. The comment "--!! Design Entity: FXU" identifies the target entity which, in HDL file 440, is design entity FXU. This declaration serves to bind the instrumentation entity to the target entity.

Input port map 453 serves as a connection between the input ports of an instrumentation entity and the signals to be monitored within the target entity. The comments begin with comment "--!! Inputs" and end with comment "--!! End Inputs". Between these comments, comments of the form "--!! inst_ent_port_name=>trgt_ent_signal_name" are utilized, one for each input port of the instrumentation entity, to indicate connections between the instrumentation entity ports and the target entity signals. The inst_ent_port_name is the name of the instrumentation entity port to be connected to the target entity signal. The trgt_ent_signal_name is the name of the signal within the target entity that will be connected to the instrumentation entity port.

In some cases a signal to be monitored lies within a descendant of a target entity. This is the case for signal S 374, which is embedded within entity C which is a descendant of entity B 326 and target FXU entity 321. Input port map 453 includes an identification string for signal S 374, which specifies the instance names of the entities within the target entity each separated by periods ("."). This identification string is pre-pended to the signal name. The signal mapping comment within input port map 453 for signal S 374 is therefore as follows:

--!! S_IN=>B.C.S;

This syntax allows an instrumentation entity to connect to any signal within the target entity or the target entity's descendant entities. A signal appearing on the top level of the target design entity, has no pre-pended entity names; and therefore, has the following signal mapping comment:

--!! R_IN=>R;

For signals on the top level of the target entity, a special connection method is provided. If the signal to be connected to has the same name as its corresponding signal in the port map of the instrumentation entity, no input port mapping comment is required and the signal will be automatically connected if no such comment is present. In other words, if the input port mapping comment is of the form:

--!! signal=>signal;

where signal is a legal signal name without periods ("."), then the input port mapping comment is not required, and the connection will automatically be made. It is also possible to provide comments of the form given above to explicitly denote the signal connection. This mechanism is only operative for signals on the top level of the target entity.

Failure message declarations 454 begin with a comment of the form "--!! Fail Outputs;", and end with a comment of the form "--!! End Fail Outputs;". Each failure event output is associated with a unique event name and a failure message. This message may be output by the simulation runtime environment upon detecting a failure event. The unique failure event name is utilized to identify the specific failure event within the model. Each failure event signal may be declared by a comment of the form "--!! n: <eventname>"failure message";" where n is an integer denoting the failure event to which the message is associated, <eventname> is the unique failure event name, and "failure message" is the message associated with the particular failure event. One and only one failure message declaration comment must be provided for each failure event monitored by the instrumentation entity.

Counter declaration comments 455 begin with a comment of the form "--!! Count Outputs;" and end with a comment of the form "--!! End Count Outputs;". Each count event output is associated with a unique variable name. This name is associated with a counter in counter logic 421 of FIG. 3B. The variable name provides a means to identify and reference the particular counter associated with a particular count event. Thus, a comment of the form "--!! n:<varname> qualifying_signal [+/−];" is associated with each counter event output. Within this convention, n is an integer denoting which counter event in the instrumentation module is to be associated with a variable name "varname," and qualifying_signal is the name of a signal within a target design entity utilized to determine when to sample the count event pulse, as will be further described herein below. The parameter "qualifying_signal" is followed by A+/−A to specify whether the qualifying signal will be a high active qualifying signal or a low active qualifying signal.

Harvest declarations 456 begin with a prologue comment of the form "--!! Harvest Outputs;" and end with a comment of the form "--!! End Harvest Outputs;". Each harvest event output is associated with a unique event name and a message that may be output by the simulation runtime environment when a harvest event has occurred during a simulation run. Each harvest event signal is declared in the form "--!! n: <eventname>"harvest message";" where n is an integer denoting which harvest event the message is to be associated with, <eventname> is the unique harvest event name and "harvest message" is the message to be associated with the particular harvest event. One, and only one, harvest message declaration comment must be provided for each harvest event monitored by the instrumentation entity.

Harvest messages and event names, fail messages and event names, and counter variable names for a simulation model are included in a simulation executable model and lists of all the events within the model are produced in separate files at model build time. In this manner, each simulation model includes the information for each event monitored and a separate file containing this information for each event is available. Furthermore, as will be described below, the model build process names each event within the model (count, fail and harvest) model in such a manner as to insure that each event has a unique name with certain useful properties.

Finally, epilogue comment 457 includes a single comment of the form "--!! End;", indicating the end of descriptor comments 451. The remainder of instrumentation entity HDL file 440 that follows the I/O declarations described above is an entity body section 458. In entity body section 458, conventional HDL syntax is utilized to define internal instrumentation logic necessary to detect the various events on the input port signals and convey these events to the output port signals.

In addition to descriptor comments 451, that are located in the HDL source code file for an instrumentation entity, an additional comment line is required in the target entity HDL file. A comment of the form "--!! Instrumentation: name.vhdl", where name.vhdl is the name of the instrumentation entity HDL file, is added to the target entity HDL source code file. This comment provides a linkage between the instrumentation entity and its target entity. It is possible to have more than one such comment in a target entity when more than one instrumentation entity is associated with the target entity. These HDL file comments will hereinafter be referred to as "instrumentation entity instantiations".

Figure 3D:
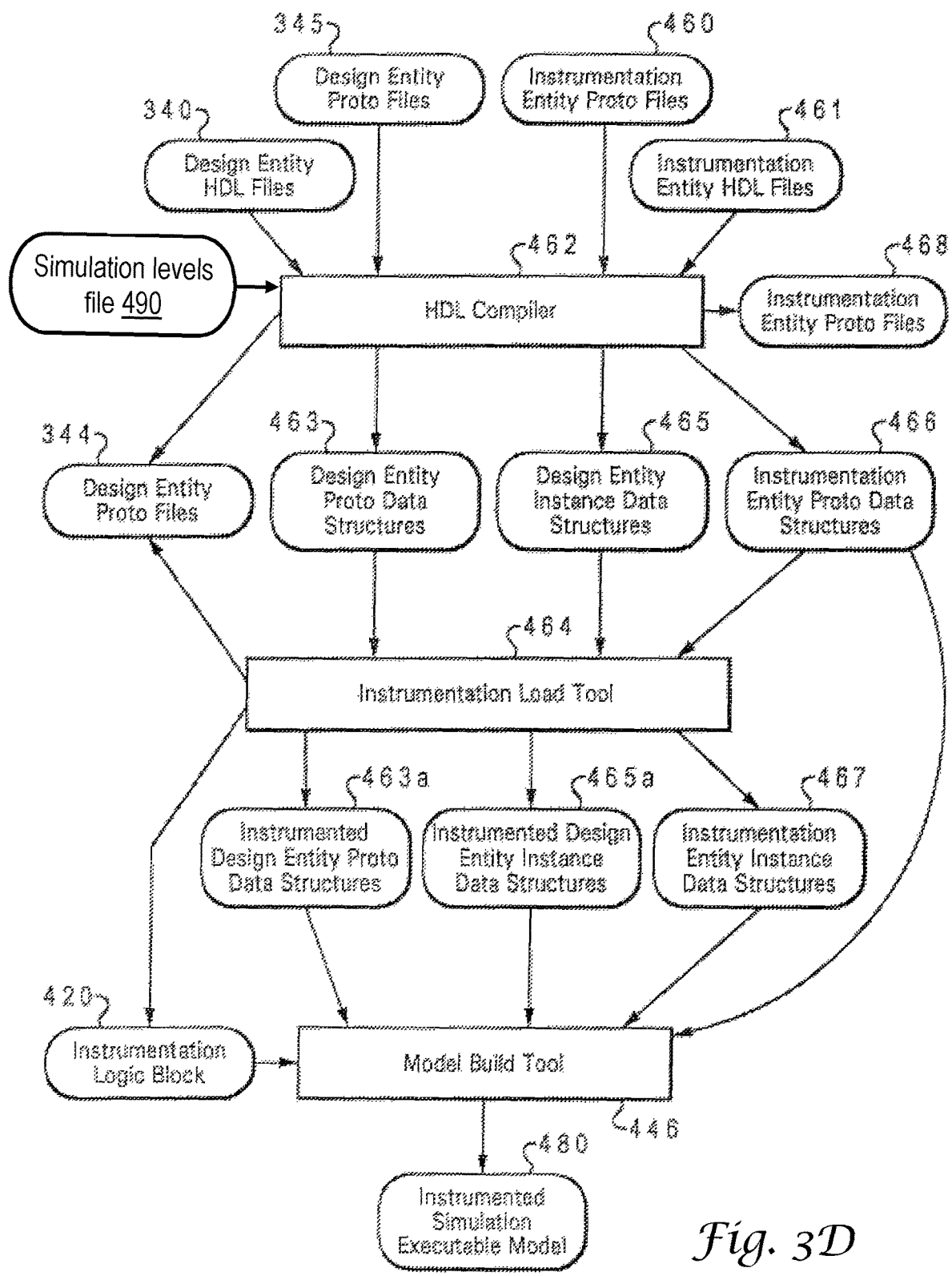
FIG. 3D is a flow diagram depicting a model build process in accordance one or more embodiments.

With reference now to FIG. 3D, there is depicted a model build process in accordance one or more embodiments. In this model build process, instrumentation load tool 464 is utilized to alter the in-memory proto and instance data structures of a simulation model thereby adding instrumentation entities to the simulation model. Instrumentation load tool 464 utilizes descriptor comments 451 within instrumentation HDL files 461 to create instance data structures for the instrumentation entities within a simulation model.

The model build process of FIG. 3D begins with design entity HDL files 340 and, potentially, one or more design entity proto files 345 (available from a previous run of HDL compiler 462), instrumentation entity HDL files 460, potentially one or more instrumentation entity proto files 461 (available from a previous run of HDL compiler 462), and a simulation levels file 490 (described below with reference to FIGS. 11-12). HDL compiler 462, processes design entity HDL files 340, and instrumentation entity HDL files 460 following an augmentation of algorithm process_HDL_file( ) that provides for efficient incremental compilation of the design and instrumentation entities comprising a simulation model. HDL compiler 462 loads proto data structures from design entity proto files 345 and instrumentation entity proto files 460, if such proto files are available and consistent. If such proto files are not available or are not consistent, HDL compiler 462 compiles design entity HDL files 340 and instrumentation entity HDL files 460 in order to produce design entity proto files 344 and instrumentation entity proto files 468. (Design entity proto files 344 and instrumentation entity proto files 468 are available to serve as design entity proto files 345 and instrumentation entity proto files 460 respectively for a subsequent run of HDL compiler 462.)

In addition, HDL compiler 462 creates in-memory design proto data structures 463 and design instance data structures 465 for the design entities of a simulation model. HDL compiler 462 also creates in-memory instrumentation proto data structures 466 for the instrumentation entities of a simulation model.

In order to minimize processing overhead HDL compiler 462 neither reads nor processes descriptor comments 451. However, HDL compiler 462 does recognize instrumentation entity instantiation comments within target entity HDL files. As such, HDL compiler 462 cannot create instance data structures instrumentation entity data structures 467. The creation of instance data structures requires interconnection information contained within descriptor comments 451 not processed by HDL compiler 462. HDL compiler 462 does, however, create instrumentation proto data structures 466.

The in-memory design proto data structures 463, design instance data structures 465, and instrumentation entity proto data structures 466, are processed by instrumentation load tool 464. Instrumentation load tool 464 examines design entity proto data structures 463 and design entity instance data structures 465 to determine those design entities that are target entities. This examination is accomplished by utilizing a particular comment format as previously described.

All target entities that are loaded from design entity proto files 345 contain an instantiation for any associated instrumentation entity. Therefore, instrumentation load tool 464 merely creates an instance data structure 467 for any such instrumentation entity and passes, the unaltered design proto data structure 463 to instrumented design proto data structure 463a, and passes design instance data structure 465 to instrumented design instance data structure 465a.

If however, a target entity is loaded from design entity HDL files 340, rather than from design entity proto files 345, instrumentation load tool 464 must alter its design proto data structure 463 and its design instance data structure 465 to instantiate an associated instrumentation entity. An instrumented design proto data structure 463a and instrumented design instance data structure 465a are thereby produced. In addition, instrumentation load tool 464 creates an instrumentation instance data structure 467 for each instrumentation entity associated with the current design entity.

The design entity proto data structures 463 that are altered by instrumentation load tool 464 are saved to disk 33 of computer system 10 as design entity proto files 344. Design entity proto files 344, which may include references to instrumentation entities, are directly loaded by a subsequent compilation of a simulation model, thus saving processing by instrumentation load tool 464 on subsequent recompilations unless an alteration is made to a design entity or an associated instrumentation entity.

In order for HDL compiler 462 to determine if alterations were made to either a target design entity or the target design entity's associated instrumentation entities, the BOM of a target design entity is expanded to include the HDL files constituting the instrumentation entities. In this manner, HDL compiler 462 can determine, by inspection of the BOM for a given design entity, whether to recompile the design entity and the design entity's associated instrumentation entities or load these structures from proto files 345 and 461.

Finally, instrumentation load tool 464 creates a unique proto and instance data structure for instrumentation logic block 420 and connects the fail, harvest, and count event signals from each instrumentation entity instantiation to instrumentation logic block 420. Model build tool 446 processes in-memory proto and instance data structures 463a, 465a, 467, 466 to produce instrumented simulation executable model 480.

In HDL compiler 462, algorithm process_HDL_file( ) is augmented to allow for the incremental compilation of design and instrumentation entities. A pseudocode implementation of a main control loop of HDL compiler 462 is shown below:

```
process_HDL_file2(file,design_flag)                     5
{                                                      10
    if (NOT proto_loaded(file)) {                      15
        if (exists_proto_file(file) AND check_bom(file)) {  20
            load_proto(file);                          25
        }else {                                        30
            parse_HDL_file(file)                       35
            for (all instances in file) {              40
                process_HDL_file2(instance, design_flag);  45
            }                                          50
            if (design_flag=TRUE) {                    55
                for (all instrumentation instances in file){  60
                    process_HDL_file2(instance, FALSE);    65
                }                                      70
            }                                          75
            create_proto(file);                        80
            write_proto_file(file);                    90
        }                                              95
    }                                                 100
    if(design_flag=TRUE) {                            105
        create_instance(file);                        110
    }                                                 115
}                                                     120
```

Algorithm process_HDL_file2( ) is an augmentation to process_HDL_file( ) of HDL compiler 342 in order to support the creation of instrumented simulation models. The algorithm is invoked with the name of the top level design entity passed through parameter file and a flag indicating whether the entity being processed is a design entity or an instrumentation entity passed through parameter design_flag (design_flag=TRUE for design entities and FALSE for instrumentation entities). Algorithm process_HDL_file2( )(line 5) first checks, by means of routine proto_loaded( )(line 15), if the proto for the current entity is already present in memory 44. If so, processing passes to line 105. Otherwise, control is passed to line 20 and 25 where disk 33 of computer system 10 is examined to determine if proto files for the entity and its descendants (including instrumentation entities, if any) exist and are consistent. If so, the appropriate proto files are loaded from disk 10 by routine load_proto( )(line 25) creating proto data structures, as necessary, in memory 44 for the current entity and the current entity's descendants including instrumentation entities.

If the proto file is unavailable or inconsistent, control passes to line 35 where the current entity HDL file is parsed. For any entities instantiated within the current entity, lines 40 to 55 recursively call process_HDL_file2( )(line 5) in order to process these descendants of the current entity. Control then passes to line 55 where the design_flag parameter is examined to determine if the current entity being processed is a design entity or an instrumentation entity. If the current entity is an instrumentation entity, control passes to line 80. Otherwise, the current entity is a design entity and lines 60 to 70 recursively call process_HDL_file2( )(line 5) to process any instrumentation entities instantiated by means of instrumentation instantiation comments. It should be noted that algorithm process_HDL_file2( )(line 5) does not allow for instrumentation entities to monitor instrumentation entities. Any instrumentation entity instantiation comments within an instrumentation entity are ignored. Control then passes to line 80 where proto data structures are created in memory 44 as needed for the current entity and any instrumentation entities. Control then passes to line 90 where the newly created proto data structures are written, as needed to disk 33 of computer system 10.

Control finally passes to line 105 and 110 where, if the current entity is a design entity, instance data structures are created as needed for the current entity and the current entity's descendants. If the current entity is an instrumentation entity, routine create_instance( )(line 110) is not called. Instrumentation load tool 464 is utilized to create the in-memory instance data structures for instrumentation entities.

It will be apparent to those skilled in the art that HDL compiler 462 provides for an efficient incremental compilation of design and instrumentation entities. It should also be noted that the above description is but one of many possible means for accomplishing an incremental compilation of instrumentation entities. In particular, although many other options also exist, much, if not all, of the functionality of instrumentation load tool 464 can be merged into HDL compiler 462.

Figure 3E:
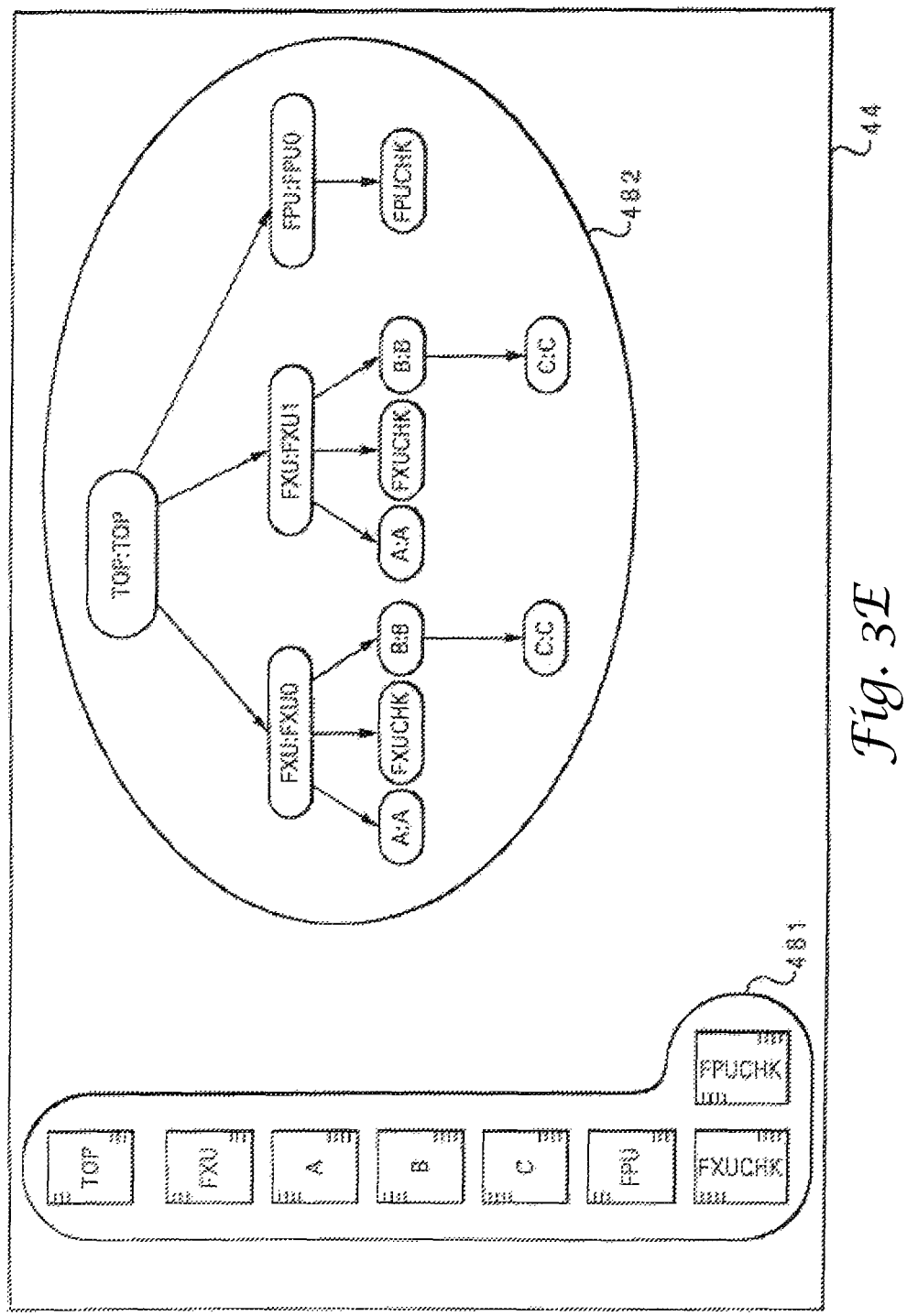
FIG. 3E is a block diagram representation of memory data structures constructed in accordance one or more embodiments.

With reference now to FIG. 3E wherein is shown a depiction of memory 44 at the completion of compilation of simulation model 329 with instrumentation entities FXUCHK and FPUCHK. Memory 44 contains proto data structures 481, one for each of the design and instrumentation entities referred to in simulation model 329. In addition, design and instrumentation instances in simulation model 329 are represented by instance data structures 482. The instance data structures are connected by means of pointers indicating the hierarchical nature of the instantiations of the design and instrumentation entities within simulation model 329.

Figure 4A:
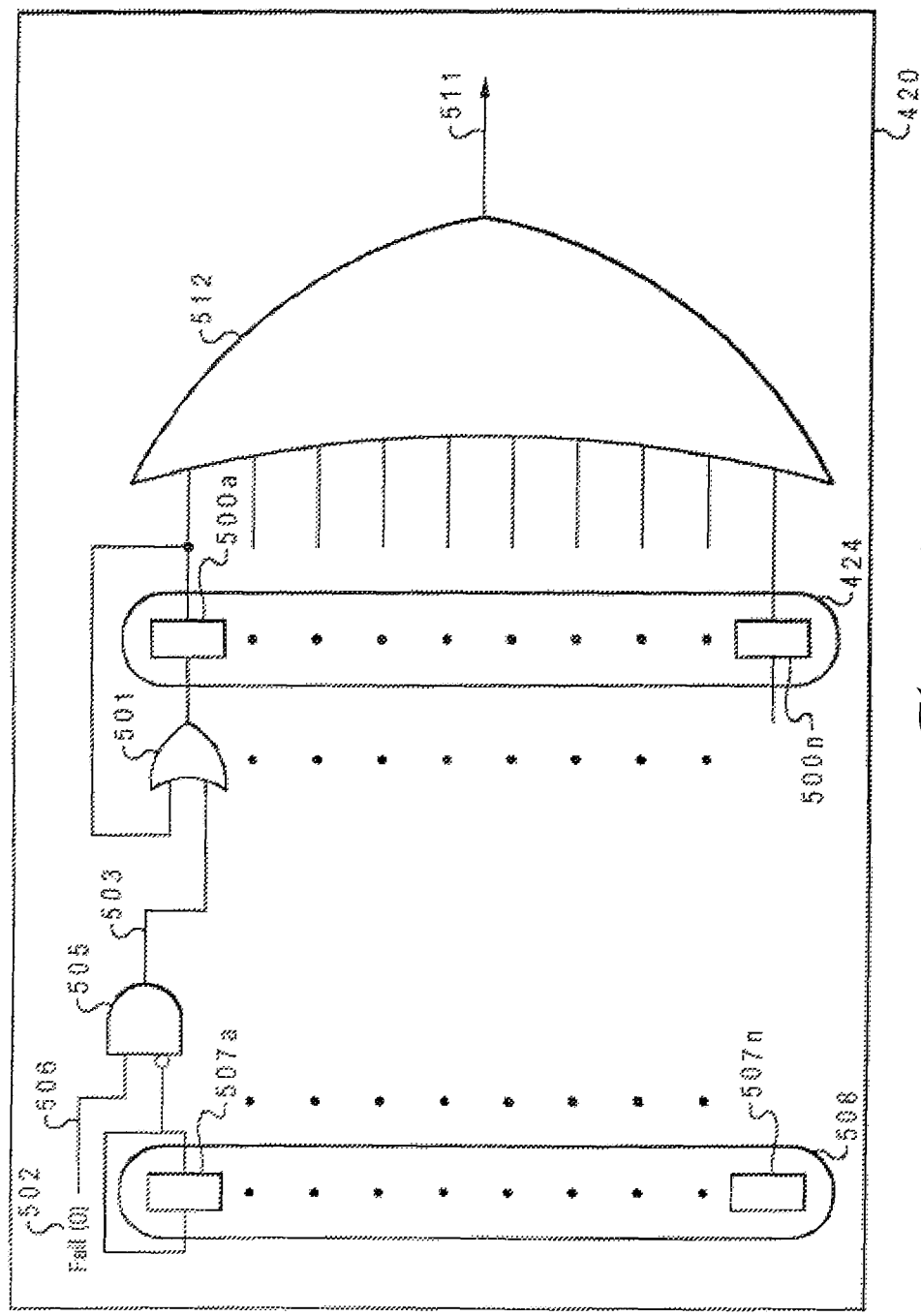
FIG. 4A is a logic diagram representation of a runtime disable mechanism in accordance one or more embodiments.

With reference now to FIG. 4A, failure flags 424 of instrumentation logic block 420 are depicted in greater detail. Failure flags 424 include registers 500a-500n utilized to accept and store an indication of the occurrence of a failure event. In what follows, the operation of a single failure flag for a particular failure event 502 will be discussed. The operation of all failure flags is similar.

Register 500a holds a value that represents whether a failure event 502 has occurred or not. Register 500a is initially set to a value of '0' by the simulation run-time environment at the beginning of a simulation run. When failure event 502, if enabled at register 507a, occurs, register 500a is set to a value of a logical>1', thereby indicating the occurrence of a failure event. Register 500a is driven by logical OR gate 501. Logical OR gate 501 performs a logical OR of the output of register 500a and a qualified failure signal 503 to create the next cycle value for register 500a. In this manner, once register 500a is set to a logical>1' by the occurrence of an enabled failure event, register 500a maintains the value of a logical>1' until reset by the simulation runtime environment. Likewise, register 500a maintains a value of '0' from the beginning of the simulation run until the occurrence of the failure event, if enabled.

Qualified failure signal 503 is driven by logical AND gate 505. Logical AND gate 505 produces, on qualified failure signal 503, the logical AND of failure signal 506 and the logical NOT of register 507*a*. Register 507*a* serves as an enabling control for qualified failure signal 503. If register 507*a* contains a value of '0', logical AND gate 505 will pass failure event signal 506 unaltered to qualified failure signal 503. In this manner, the monitoring of the failure event is enabled. Registers 507*a*-507*n* are set, by default, to a value of '0'. However, if register 507*a* contains a value of a logical>1', qualified failure signal 503 will remain at a value of '0' irrespective of the value of failure event signal 506, thereby disabling the monitoring of failure event 502. In this manner, register 508, which includes registers 507*a*-507*n*, can mask the occurrence of any subset of failure events in the overall simulation model from registers 500*a*-500*n*.

To efficiently implement the ability to selectively disable the monitoring of failure events, the simulation run-time environment includes a function that allows a user to disable monitoring of a specific failure event for a given instrumentation entity. This function will automatically set the appropriate registers among registers 507*a*-507*n* within register 508 to disable the monitoring of a particular failure event for every instance of the instrumentation entity within the overall simulation model. Instrumentation load tool 464 and model build tool 446 encode sufficient information within instrumented simulation executable model 480 to determine which failure bits within register 508 correspond to which instrumentation entities.

The ability to selectively disable monitoring of failure events is of particular use in large batch-simulation environments. Typically, in such an environment, a large number of general purpose computers, running software or hardware simulators, are dedicated to automatically running a large number of simulation runs. If a simulation model with a faulty instrumentation entity that incorrectly indicates failure events is run in such an environment, a large number of erroneous failures will be generated causing lost time. By selectively disabling failure events within instrumentation entities, simulation can continue while only disabling erroneous failure signals rather than having to disable all failure monitoring. This option is particularly useful when the process of correcting a faulty instrumentation entity and creating a new simulation model is substantially time consuming. Similar enabling and disabling structures can also be advantageously implemented for the harvest and count events within a model.

Logical OR gate 512 is utilized to produce a signal 511, which indicates whether any failure event within the model has occurred. This signal is utilized to allow hardware simulators to efficiently simulate simulation models that have been instrumented according to the teachings of the present disclosure.

Figure 4B:
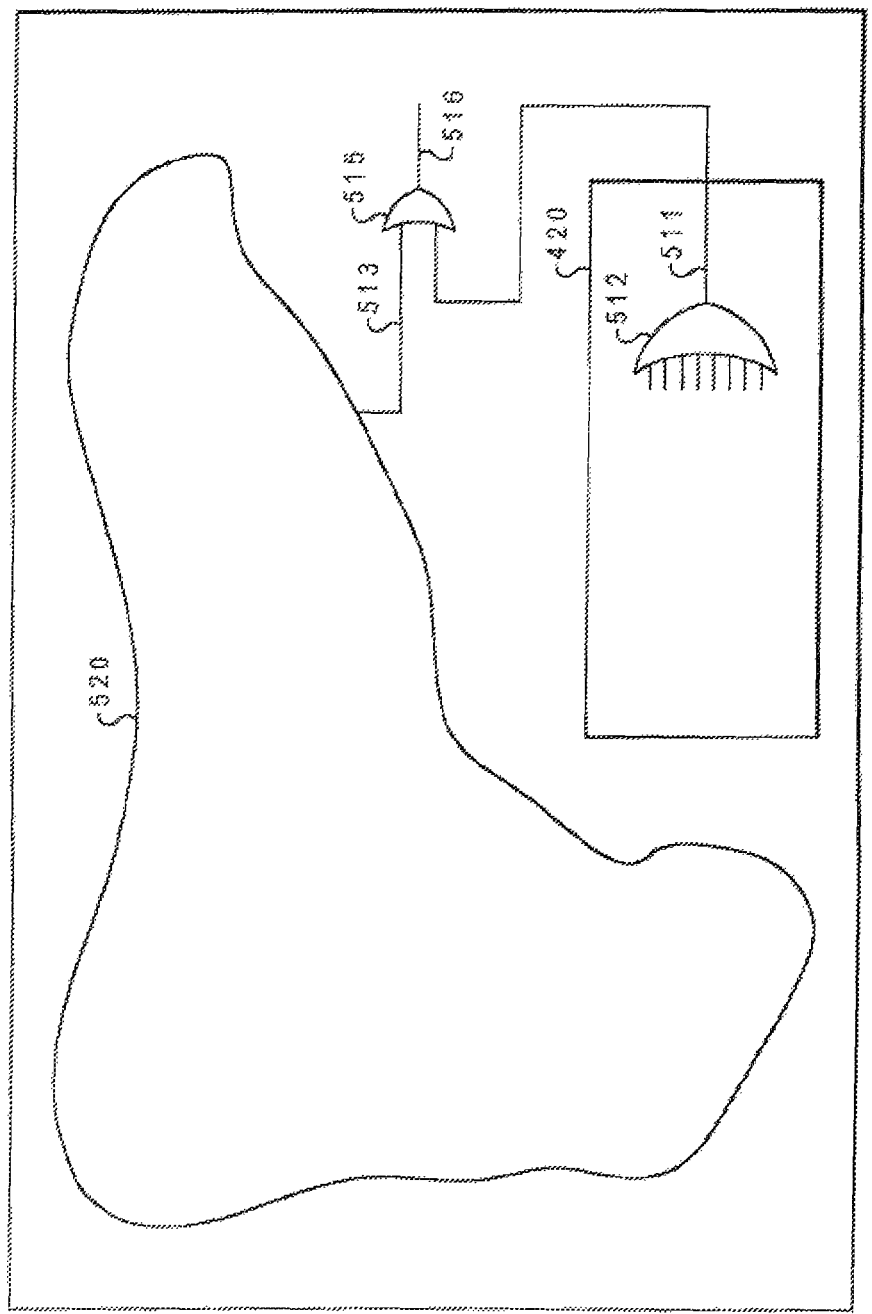
FIG. 4B is a block diagram representation of functional units utilized to perform simulation on a hardware simulator in accordance one or more embodiments.

With reference now to FIG. 4B, features utilized to support efficient execution of an instrumented simulation model on a hardware simulator are illustrated in greater detail. It should be noted that for most hardware simulators, the operation of polling a facility within a simulation model during a simulation run is often a time consuming operation. In fact, if facilities must be polled every cycle, it is often the case that as much time, if not considerably more, is spent polling a simulation model for results rather than running the actual simulation. As such, it is advantageous when using a hardware simulator to avoid polling facilities within the model during a simulation run. In addition, many hardware simulators provide a facility that instructs the hardware simulator to run a simulation without interruption until a specific signal within the simulation model attains a specific value. This facility usually results in the highest performance for a simulation run on a hardware simulator.

In order to execute simulation model 520 on a hardware simulator, a termination signal 513, is typically utilized as a means to avoid having to poll the model after each cycle. Typically, a hardware simulator will cycle simulation model 520 until signal 513 is asserted to a logical>1'. The assertion of termination signal 513 to a logical>1' indicates that a simulation run has finished. Without termination signal 513, it would be necessary to directly poll facilities within simulation model 520 to determine when a simulation run is completed.

To efficiently locate and diagnose problems in simulation model 520, it is advantageous to allow a simulation run to be stopped immediately whenever a failure event occurs during simulation of simulation model 520 (harvest events and count events are typically only polled at the end of a simulation run). This allows a user to easily locate the failure event within the simulation run, thereby facilitating debugging of the failure. In order to allow simulation models that have been instrumented as described herein to efficiently execute on a hardware simulator, a comment of the form "--!! Model Done: signalname" is placed within the HDL source code file for the top level entity of the simulation model where signalname is the name of termination signal 513 within the simulation model. This comment is only utilized if present in the HDL file for the top-level entity. If such a comment is present in the HDL source code file for the top level entity, a logical OR gate 515 will automatically be included within the simulation model. Logical OR gate 515 produces the logical OR of signals 511 and 513 on signal 516. Signal 516 is therefore asserted to a logical>1' whenever the simulation run has completed (signal 513 high) or a failure event has occurred (signal 511 high). Consequently, by executing simulation model 520 in a hardware simulator until signal 516 is asserted to a value of a logical>1', the instrumentation for simulation model 520 can be combined and utilized along with existing simulation termination techniques in a seamless manner. In the alternative, if the comment indicating the name of termination signal 513 is not present, logical OR gate 515 is not included in the model and signal 511 is directly connected to signal 516. The name of signal 516 is fixed to a particular name by convention.

In many simulators, the passage of time within the simulated model is modeled on a cycle-to-cycle basis. That is to say, time is considered to pass in units known as cycles. A cycle is delineated by the occurrence of a clock signal within a simulation model that regulates the updating of storage elements within the design. These simulators are commonly known as "cycle simulators". A cycle simulator models a digital design by repeatedly propagating the values contained within storage elements through interconnecting logic that lies between storage elements without specific regard for the physical timing of this propagation, to produce next cycle values within the storage elements. In such simulators, a primitive storage element, hereinafter referred to as a "simulator latch", is utilized to model the storage elements within a digital design. One simulator cycle therefore entails propagating the current values of the simulator latches through the interconnecting logic between storage elements and updating the simulator latches with the next cycle value.

In many circumstances, however, it is not possible to utilize a single simulator latch to directly model the storage elements within a design. Many common storage elements utilized within digital designs often require more than one simulator latch. For example, so called master-slave flip-flops are generally modeled utilizing two simulator latches to accurately simulate the behavior of such storage elements. In order to efficiently model storage elements, a designer will typically refer to a library that contains storage element simulation models for use in a design. These design storage elements are modeled by one or more simulator latches. Storage elements comprised of one or more simulator latches that are implemented within a design will be referred to herein below as "design latches."

As a consequence of utilizing multiple simulator latches to model a design latch, the process of propagating the input of a design latch to its output, which constitutes a design cycle, often requires more than one simulator cycle. A single design cycle is thus defined as comprising the number of simulator cycles required to propagate a set of values from one set of storage elements to the next.

In other circumstances, a simulation model may include distinct portions that are clocked at differing frequencies. For example, a microprocessor core connected to a bus interface unit, may operate at a higher frequency and than the bus interface unit. Under these circumstances, the higher frequency portion of the design will require one or more simulator cycles, say N cycles, to simulate a single design cycle. The lower frequency portion of the design will require a multiple of N simulator cycles in order to simulate a design cycle for the lower frequency portion. This multiple is equal to the ratio of the frequency of the higher speed design portion to the frequency of the lower speed design portion. It is often the case that certain portions of the logic can be run at a number of differing frequencies that are selectable at the beginning of a simulation run. Such logic, with a run-time selectable frequency of operation, presents unique challenges for monitoring count events.

With reference now to FIG. 5A, there is depicted a gate level representation of exemplary logic for one counter of counters 421 within instrumentation logic block 420 depicted in FIG. 3B. Each counter of 421 is represented by a multi-bit simulator latch 600. Simulator latch 600 is initialized by the simulation runtime environment to a value of zero at the beginning of a simulation run. Simulator latch 600 is updated every simulator cycle and is driven by multiplexer 601. Multiplexer 601, controlled by selector signal 602, selects between signal 613, the current value of simulator latch 600, and signal 605, the current value of simulator latch 600 incremented by 1 by incrementer 604, to serve as the next cycle value for simulator latch 600. By selecting signal 605, multiplexer 601 causes the counter value within simulator latch 600 to be incremented when a count event occurs. It should be noted, however, that simulator latch 600 is updated every simulator cycle irrespective of the number of simulator cycles that correspond to a design cycle for the logic being monitored by a counting instrument. Logical AND gate 606 and simulator latch 607 serve to disable the monitoring of count event signal 609 in a manner similar to that described above for the disabling of failure events. Signal 608 is count event signal 609 further qualified by signal 610 by means of logical AND gate 611.

Signal 610 insures that simulator latch 600 will be incremented, if count event signal 609 is active, only once per design cycle for the logic being monitored by a counting instrument irrespective of the number of simulation cycles utilized to model the design cycle. This clocking normalization is necessary to ensure that the event counts recorded in counters 421 correspond directly to the number of design cycles the event occurred in and not the number of simulator cycles the event occurred in. For example if an event occurs in two design cycles where design cycle require four simulators cycles, it is preferable to have the event counter reflect a value of two rather than a value of eight as would occur if the counter were allowed to update in every simulator cycle.

Furthermore, if the count event being monitored is within a portion of the logic with a run-time selectable frequency of operation, it is useful to have the count registers reflect the number of occurrences of the event in terms of design cycles. For example, consider a circumstance where a count event occurs twice during two different simulation runs. In the first run, assume that four simulator cycles are needed to represent each design cycle. Further assume in the second run that twelve simulator cycles are necessary to represent each design cycle. Without a clocking normalization mechanism, the first run would indicate that the event occurred eight times (two occurrences times four simulator cycles per occurrence) and the second run would indicate that the event occurred twenty-four times (two occurrences times twelve simulator cycles per occurrence) when in fact the event actually only occurred twice in both simulation runs. Therefore, it would be advantageous to limit the updating of counters 421 such that each counter is only updated once per design cycle irrespective of the number of simulator cycles, possibly variable at run-time, needed to represent a design cycle.

In simulation models in which multiple simulator cycles are utilized to represent a single design cycle, explicit clocking signals are utilized within the model to control the updating of the various design storage elements. These clocking signals specify in which simulator cycles the simulator latches representing design storage elements are allowed to update. A clocking signal is asserted high for some contiguous number of simulator cycles at either the beginning or end of the design cycle and asserted low for the remaining simulator cycles within the design cycle. If the clocking signal is asserted high during the beginning of the design cycle, the clock is referred to as a "high-active" clock and, likewise, if the clocking signal is asserted low during the beginning of the design cycle, the clock is referred to as a "low-active" clock.

Each count event signal has an associated qualifying signal as specified by counter declaration comments 455 as described above. Typically, these qualifying signals are connected to the clocking signals within the design responsible for updating the storage elements within the portion of logic monitored by the count event. The qualifying signal for the count event for simulator latch 600, qualifying signal 612, is depicted as a high-active qualifier signal. Qualifying signal 612 is processed by simulator latch 613 and logical AND gate 614, to produce signal 610 which is active high for one and only one simulator cycle within the design cycle delineated by qualifying signal 612.

Turning now to FIG. 5B there is illustrated a simplified timing diagram that demonstrates operation of simulator latch 613 and logical AND gate 614 assuming clocking qualifying signal 612 is a high active clocking signal of fifty percent duty cycle for a design cycle that occurs over a 10-simulation cycle period. Signal 615, the output of simulator latch 613, is qualifying signal 612 delayed by one simulator cycle. Signal 615 is inverted and logically ANDed with qualifying signal 612 to produce signal 610, a high-active pulse that is asserted for the first simulator cycle of the design cycle. In a similar fashion, if the qualifying clock signal is low active, qualifying signal 612 would be inverted and signal 615 would be uninverted by logical AND gate 614. This would produce a single simulator cycle active high pulse during the first simulator cycle of the design cycle.

Qualifying signal 610, by qualifying count event signal 609 by means of logical AND gate 611, insures that counter 600 is incremented only once per design cycle irrespective of the number of simulator cycles utilized to represent a design cycle.

In contrast to cycle simulators, another class of simulators know as "event-driven" simulators is commonly utilized. In an event driven simulator, time is modeled in a more continuous manner. Each rising or falling edge of a signal or storage element within a design is modeled with specific regard to the physical time at which the signal transition occurred. In such simulators, the simulator latches operate in a slightly different manner than for a cycle based simulator. A simulator latch in an event driven simulator is controlled directly by a clocking signal. A new value is loaded into the simulator latch on either the rising or falling edge of the clocking signal (called a "positive-edge triggered" latch and a "negative-edge triggered" latch respectively). If an event driven simulator is utilized, latch 613 and logical gates 614 and 611 are unnecessary. Rather, counter latch 600 is replaced by a positive or negative edge triggered simulator latch based on the polarity of qualifying signal 612. Qualifying signal 612 is connected directly to simulator latch 600 and directly controls the updates of counter latch 600 insuring that the latch is updated only once per design cycle.

Figure 6A:
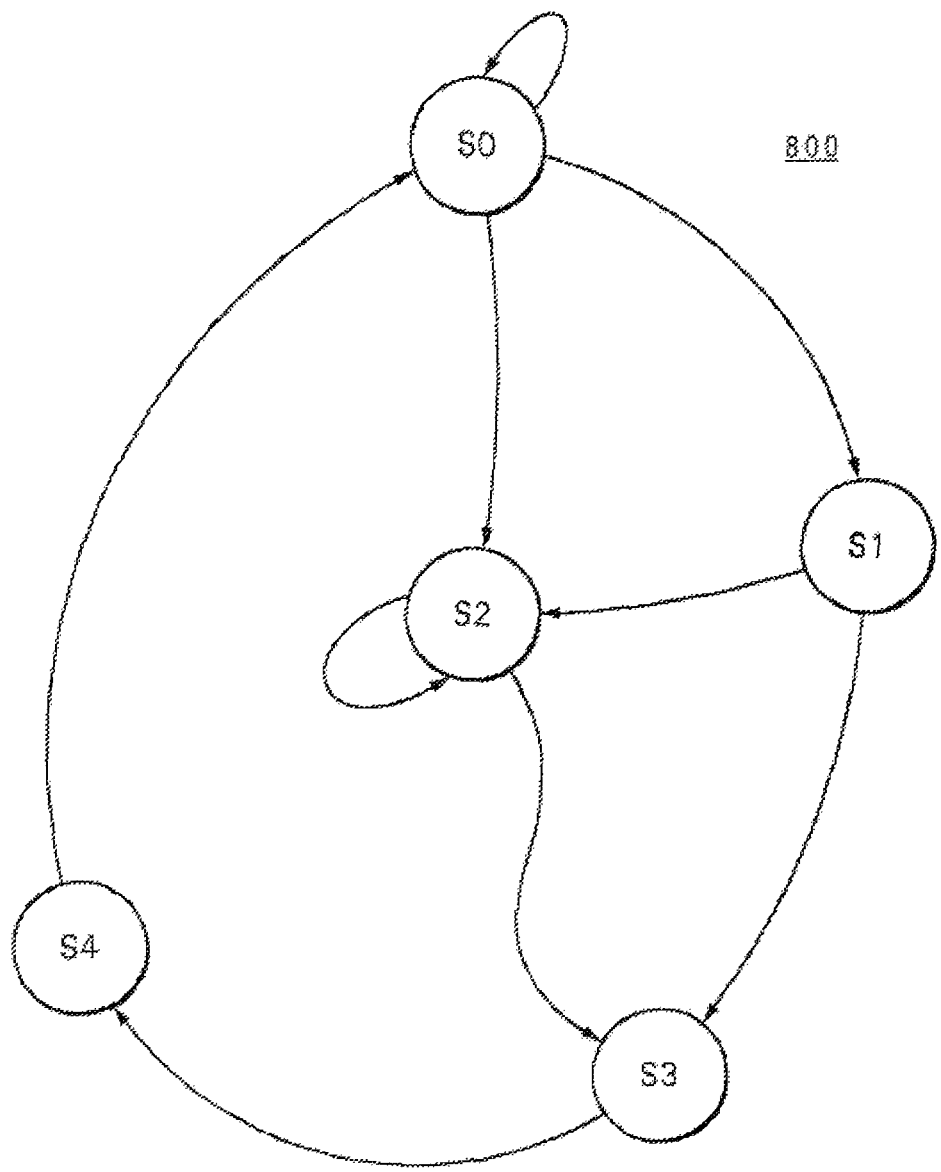
FIG. 6A illustrates a conventional finite state machine that may be instrumented with an embedded checker in accordance one or more embodiments.

Returning to FIG. 6A, incrementer 604 represents but one possible mechanism that may be utilized to implement the next logic state for a given counter in one or more embodiments. As depicted in FIG. 6A, incrementer 604 ensures that counters 421 within a model are cycled through a series of values whose binary patterns correspond to the customary representation of non-negative integers. In one embodiment, incrementer 604 is comprised of an adder that increments the current value of counter 600 by a unit value each time signal 605 is selected by selector signal 602. This exemplary implementation provides for convenience of decoding the value of counter 600 at the termination of a simulation run, but does so at a cost in overhead that is not acceptable in many simulators.

For software simulators, one of two basic approaches may be utilized to model an incrementer, such as incrementer 604. In the first approach, the incrementer is modeled directly by an ADD or INCREMENT instruction in the simulation execution model. When incrementers are modeled directly as a single instruction within the simulation execution model, the use of incrementer 604 provides for efficient counters within a simulation execution model.

However, many software simulators and virtually all hardware simulators model incrementer functions as a set of gates that are replicated essentially without change at each bit position of the counter. Within a software simulator, these gates must be translated into a sequence of instructions. In a hardware simulator, these gates are explicitly replicated for each counter as individual gates. Due to implementation or structural limitations, many software simulators are incapable of modeling an incrementer in any other manner than as a set of gates. Clearly, for these software simulators that must model incrementers as a number of gates and therefore as a sequence of instructions, a performance loss will result over those software simulators that model incrementers as a single increment or add instruction. Likewise, for hardware simulators, the number of gates required for each adder, which must be modeled directly by gates within the hardware simulator, can prove to be a significant burden. These difficulties can be alleviated, for example, by implementing a linear feedback shift register (LFSR) as the counter means within counting instrumentation.

While the above described techniques enable effective instrumentation of simulation models, in certain circumstances additional techniques may be used in order to enhance the ease with which a user may instrument a simulation model. In design, it often occurs that there are common design or instrumentation logic constructs that are often repeated and possess a regular structure.

By utilizing knowledge of the regular structure of these design and instrumentation logic constructs, it is often possible to define a syntax that describes the instrumentation logic with considerably greater efficiency than would be possible utilizing a conventional HDL construct. By utilizing this syntax as an unconventional HDL comment within a design VHDL file, it is possible to create instrumentation entities with considerably greater ease and efficiency.

Such comments within a design entity will be referred to herein below as an embedded instrumentation entity comment while the instrumentation logic created by such a comment will be referred to as an embedded instrumentation entity.

A common logic design construct is the so-called "finite state machine". A finite state machine typically includes a number of storage elements to maintain the "state" of the state machine and combinatorial logic that produces the next state of the state machine and its outputs. These constructs occur with great frequency in typical logic designs and it is advantageous to be able to efficiently instrument these constructs.

A typical set of count and failure events for a finite state machine includes counting the number of times a state machine cycles from a given current state to some next state, counting the number of functional cycles the state machine spends in each state, ensuring that the state machine does not enter an illegal state, and ensuring that the state machine does not proceed from a current given state to an illegal next state. This list of events is but one of many possible sets of events that can be used to characterize a finite state machine and is used in an illustrative manner only.

With reference now to FIG. 6A, there is depicted a representation of an exemplary state machine 800. Exemplary state machine 800 includes five states, labeled S0, S1, S2, S3, and S4 respectively, and nine legal state transitions between these states. In what follows, it is assumed that state machine 800 includes three latches and a set of combinatorial logic to produce the next state function. It is further assumed that the states are encoded into the three latches following the usual and customary encoding for integers. That is to say, state S0 gets an encoding of $000_{bin}$, state S1 gets an encoding of $001_{bin}$, state S2 gets and encoding of $010_{bin}$, and so on.

Figure 6B:
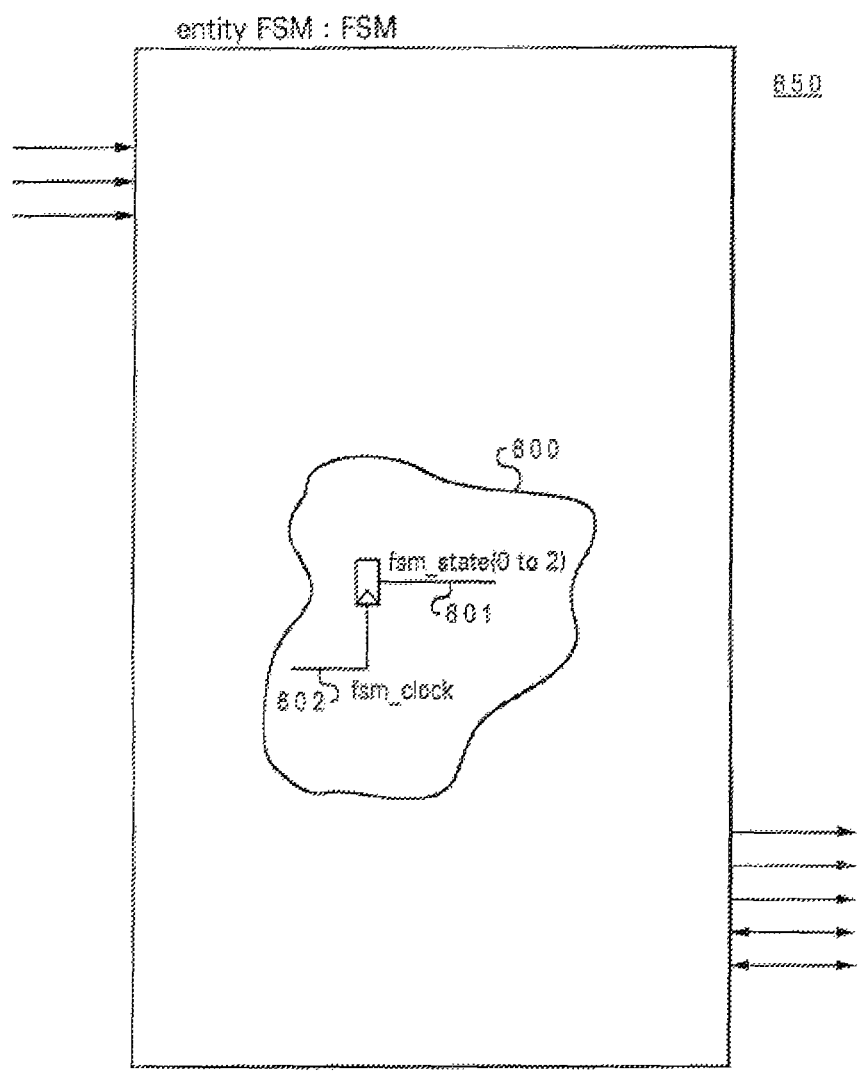
FIG. 6B depicts a conventional finite state machine design entity.

Referring now to FIG. 6B, there is shown an exemplary design entity 850 referred to as entity FSM with instance name FSM, which contains one instance of state machine 800. Furthermore, a signal output 801, "fsm_state(0 to 2)" contains a three bit signal directly connected to the outputs of the three storage elements comprising the state elements of state machine 800. A signal input 802, fsm_clock, applies a clocking signal that controls the storage elements for state machine 800.

In order to instrument state machine 800, it would conventionally be necessary to create an instrumentation entity VHDL file containing the logic necessary to detect the desired state machine events and pass them through to count and fail events. Such an instrumentation entity file with appropriate instrumentation entity descriptor comments would typically require substantially more lines of code than the HDL description of the state machine itself. Such a circumstance is undesirable. However, in the case of a regular logic structure such as a finite state machine, it is possible to define a brief syntax that characterizes the finite state machine without resorting to a separate instrumentation VHDL entity.

With reference now to FIG. 6C, there is illustrated an exemplary HDL file 860 for generating design entity 850 with an embedded instrumentation entity for monitoring the behavior of FSM 800. Specifically, an embedded instrumentation entity comment 852 is illustrated. As depicted in FIG. 8C, embedded instrumentation entity comment 852 comprises a number of distinct sections including: a prologue and embedded instrumentation name declaration 853, a state machine clock declaration 859, a state element declaration 854, a state naming declaration 855, a state element encoding declaration 856, a state machine arc declaration 857, and an epilogue 858.

Prologue and embedded instrumentation entity name declaration comment 853 serves to declare a name that is associated with this embedded instrumentation entity. This comment line also serves to delineate the beginning of an embedded instrumentation entity comment sequence.

As further depicted in FIG. 6C, declaration comment 853 assumes a non-conventional syntax of the form: "--!! Embedded TYPE: name", wherein "--!! Embedded" serves to declare an embedded instrumentation entity, "TYPE" declares the type of the embedded instrumentation entity B FSM in this case, and "name" is the name associated with this embedded instrumentation entity.

State machine clock declaration comment 859 is utilized to define a signal that is the clocking control for the finite state machine.

State element declaration comment 854 is utilized to specify the state-machine state storage elements. This comment declares the storage elements or signal names that constitute the state-machine state. In state machine 800, the signals fsm_state(0 to 2) constitute the state machine state information.

State naming declaration comment 855 is utilized to declare labels to associate with various states of the given state machine. These labels are utilized in state machine arc declaration comment 857 when defining the legal state transitions within the given state machine.

State element encoding declaration comment 856 is utilized to define a correspondence between the state machine labels defined by state naming declaration comment 855 and the facilities declared by state element declaration comment 854. In the example shown, the labels of comment 855 are associated by position with the encodings given in comment 856 (i.e., the state labeled "S0" has the encoding $000_{bin}$, the state labeled "S1" has the encoding $001_{bin}$, etc.).

State-machine arc declaration comment 857 defines the legal state transitions within the state machine. The various transitions of the state machine are given by terms of the form "X=>Y" where X and Y are state machine state labels given by comment 855 and X represents a previous state machine state and Y a subsequent state machine state.

Epilogue comment 858 serves to close the embedded instrumentation entity comment. The specific syntax and nature of the comments between the prologue and embedded instrumentation name declaration and the epilogue will vary with the specific needs of the type of embedded instrumentation entity being declared.

Embedded instrumentation entity comment 852 is inserted within the VHDL file of the design entity that contains the finite state machine in question. The embedding of instrumentation for finite state machine 800 is made possible by the non-conventional comment syntax illustrated in FIG. 8C and is substantially more concise than a conventional HDL instrumentation entity suitable for accomplishing the same function.

Utilizing such embedded non-conventional comments, a simulation system as disclosed herein creates an instrumentation entity, as described below, for instrumenting the state machine without the need to resort to creating a separate HDL file instrumentation entity.

To support compilation and creation of embedded instrumentation entities, the previously described compilation process of FIG. 4D is enhanced as described herein. First, HDL compiler 462 is altered to recognize the presence of embedded instrumentation entity comments. If, during compilation of a design HDL file, and subject to the constraints described above for incremental compilation, HDL compiler 462 detects one or more embedded instrumentation entity comments within the source code file, HDL compiler 462 places a special marker into design entity proto data structure 463.

When instrumentation load tool 464 is passed control, proto data structures 463 are searched in order to locate the special marker placed by HDL compiler 462 indicating embedded instrumentation entity comments. Such protos represent the design HDL files with embedded instrumentation entities that have been re-compiled in the current compilation cycle.

When instrumentation load tool 464 locates a proto data structure 463 with the special marker, the corresponding VHDL source code file for the design entity is opened and parsed to locate the one or more embedded instrumentation entity comments. For each of these comments, instrumentation load tool 464 creates a specially named proto data structure 463a, and further generates a corresponding instance data structure 465a that is instantiated within the design entity. In addition, instrumentation load tool 464 removes the special marker inserted by HDL compiler 462 to prevent unnecessary re-instrumentation of the design proto on subsequent re-compiles.

Within these created embedded instrumentation entity protos, instrumentation load tool 464 directly creates the necessary instrumentation logic required by the embedded instrumentation entity without the need for a VHDL file to specify this instrumentation and connects this logic to instrumentation logic block 420 of FIG. 4D. The updated design proto along with the embedded instrumentation entity proto and instance data structure are saved to disk and serve as inputs to subsequent compiles, removing the need to produce embedded instrumentation entities on subsequent recompiles.

Figure 7:
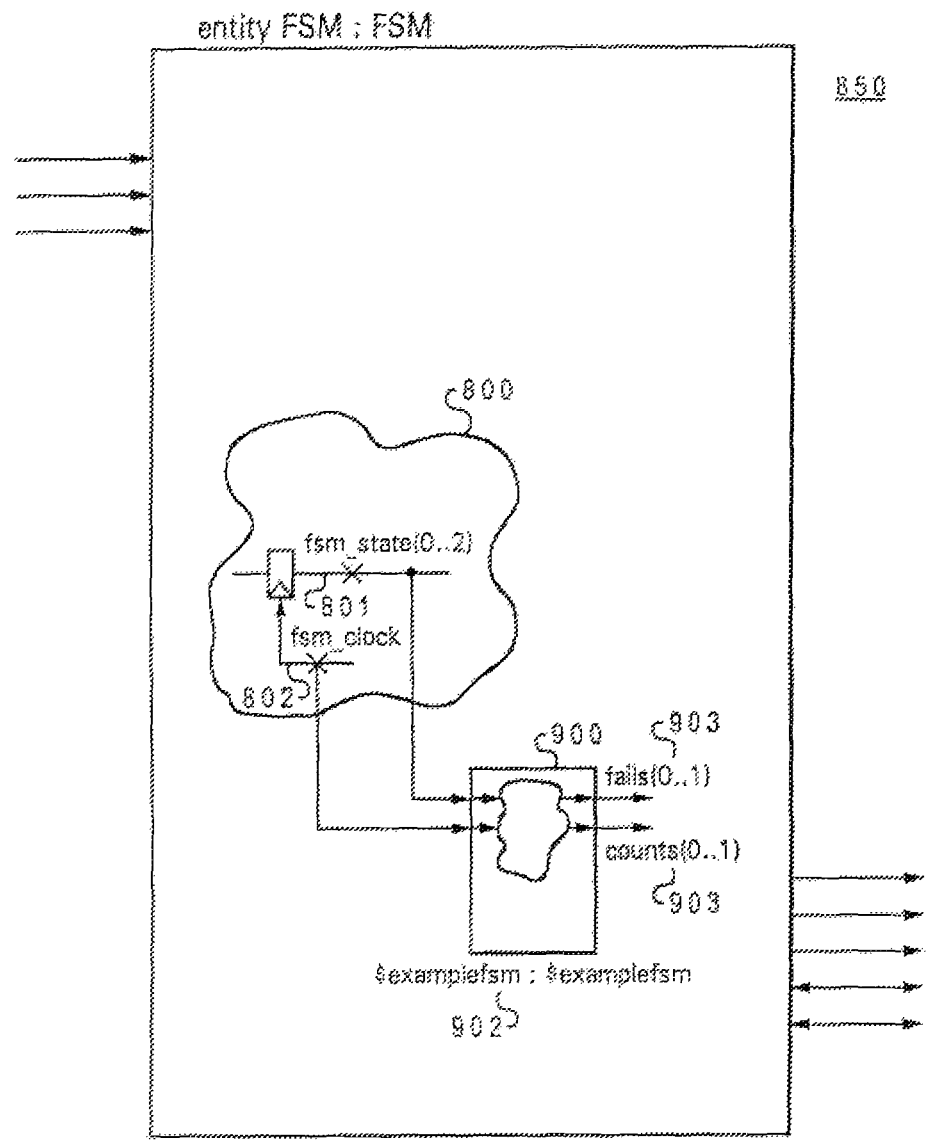
FIG. 7 depicts a hardware description language design entity included embedded instrumentation in accordance one or more embodiments.

With reference now to FIG. 7, design entity 850 is shown instrumented with embedded instrumentation entity 900. Embedded instrumentation entity 900 is created as a proto instantiated within design entity 850 wherein the embedded non-conventional instrumentation entity comment occurs. The embedded instrumentation entity thus may be replicated automatically within an overall design wherever the specific design entity is instantiated.

Embedded instrumentation entity 900 is named in a unique manner based on the name associated with the embedded instrumentation entity by the prologue and embedded instrumentation name declaration comment. This name is pre-pended with a special character (shown as a "$" in FIG. 9) that is not a recognized naming convention for the platform HDL. In this manner, the names of the embedded instrumentation entities cannot conflict with the names of any other design or standard instrumentation entities.

Furthermore, the names associated with the various events defined by the embedded instrumentation entity (the "varname" for the count events, for example) are also derived in a fixed manner from the name associated with the embedded instrumentation entity. The user is required to ensure that the names of embedded instrumentation entity events do not conflict with the names of standard instrumentation entity events and further than the names of the embedded instrumentation entities within a given design do not themselves conflict.

It should also be noted that if a design entity contains more than one embedded instrumentation entity, the embedding process described with reference to FIG. 6B and FIG. 7 is simply repeated for each such instrumentation entity. In addition, since the protos for the embedded instrumentation entities are created at the same time as the design protos itself, no changes to the BOM mechanism used for incremental compiles are required. The protos for the embedded instrumentation entities can be considered, for purposes of incremental compilations, to be mere extensions to the design proto itself.

The present disclosure provides a technique for naming events within a simulation model that prevents name collisions between events in different instrumentation entities, allows for the arbitrary re-use of components of a model in models of arbitrarily increasing size, and furthermore allows for processing designated events in a hierarchical or non-hierarchical manner.

When all instances of an event are considered as a whole without regard to specific instances, the event is considered in a "non-hierarchical" sense. Likewise, when an event is considered with regard to each and every instance, it is considered in a "hierarchical" sense. When considering count events, for example, it is often convenient to track the number of times a particular count event occurred in the aggregate without concern to exactly how many times the count event occurred in each particular instance within a simulation model.

Each type of event: count, fail, and harvest, is given a separate event namespace by construction. Each event class is therefore an independent group preventing naming collisions between the event types. The data structure is independently applied to each of the different event types to ensure correctness within each event class.

In the embodiments illustrated in FIGS. 8A-8D, the embodiments are described with respect to count events. One skilled in the art will appreciate and understand the extensions necessary to apply the same techniques to other event classes such as failures or harvests.

With reference to FIG. 8A, there is depicted a block diagram representation of simulation model 1000 containing a number of design and instrumentation entities. As illustrated in FIG. 8A, simulation model 1000 includes two instances of a design entity X, with instance names X1 and X2 respectively.

Within each of design entity instances X1 and X2 is instantiated an instance of an instrumentation entity B3, 1012*a* and 1012*b*. Design entity instances X1 and X2 further comprise instances, 1014*a* and 1014*b*, respectively, of design entity Z which further contains instances, 1016*a* and 1016*b*, of instrumentation entity B1 and instances, 1018*a* and 1018*b*, of instrumentation entity B2.

Finally, simulation model 1000 includes an instance of design entity Y, with instance name Y, containing an instance of instrumentation entity B4 1022. Design entity instance Y contains an instance, 1024, of design entity Z with further instances, 1016*c* and 1018*c*, of instrumentation entities B1 and B2 respectively.

In what follows, a technique for uniquely naming events is considered in the context of exemplary model 1000. It is assumed in the following description that each instrumentation entity (B1, B2, B3, and B4) has declared a single count event with event name "count1".

In accordance one or more embodiments, the user must uniquely name each type of event (count, fail, or harvest) within a specific instrumentation entity, i.e., the user cannot declare any two events of the same type within the same instrumentation entity with the same event name. Such a constraint does not conflict with the stated goals in that a given instrumentation entity is usually created by a specific person at a specific point in time, and maintaining unique names within such a limited circumstance presents only a moderate burden to the user. The data structure disclosed herein does, however, prevent all name collisions between events in different instrumentation entities, and allows for processing the events in a hierarchical and/or non-hierarchical manner.

As previously explained, an HDL naming convention must uniquely identify all the entities within a given design. This constraint is inherent to HDLs and applies to design entities as well as instrumentation entities. In accordance with conventional VHDL entity naming constructs, it is technically possible for two design entities to share the same entity name, entity_name. However, such identically named entities must be encapsulated within a VHDL library from which a valid VHDL model may be constructed. In such a circumstance, entity_name, as it is utilized herein, is equivalent to the VHDL library name concatenated by a period (".") to the entity name as declared in the entity declaration.

Pre-pending a distinct VHDL library name to the entity name disambiguates entities sharing the same entity name. Most HDLs include a mechanism such as this for uniquely naming each design entity. Design entities must be unambiguously named in order to determine which particular entity is called for in any given instance in a simulation model. The prevailing naming mechanism of the native HDL is preferably utilized to assign unique entity names for design entities throughout a given model and leverages the uniqueness property of entity names and the uniqueness of each instance's instantiation identifier to create an "extended event identifier" for each event within the simulation model.

With reference to FIG. 8B, there is illustrated a representation of the fields in an extended event identifier data structure, alternatively referred to herein as an "event list", in accordance with one or more embodiments. The extended event identifier begins with instantiation identifier field 1030. This field, as described hereinbefore, includes the instance identifiers, proceeding from the top level entity to the direct ancestor of the given instance within the simulation model, separated by periods ("."). This string is unique for each and every instance of the event within the model. The extended event identifier further includes an instrumentation entity field 1032, a design entity field 1034, and an eventname field 1036.

Instrumentation entity field 1032 contains the name of the instrumentation entity (or the name assigned to an embedded instrumentation entity) that generates the simulation event. Design entity field 1034 contains the entity name of the design entity in which the event occurs. Eventname field 1036 is the name given to the event in the instrumentation entity description comments of an instrumentation entity or the event name assigned to an event within an embedded instrumentation entity. These four namespace fields comprise a unique identifier for each event within a simulation model that allows for the re-use of components within other models without risk of name collisions and the consideration of events in a hierarchical or non-hierarchical sense.

With reference now to FIG. 8C, there is shown a list of extended event identifiers for model 1000. Event identifiers 1040, 1041, 1042, 1043, 1044, 1045, 1046, 1047, and 1048 are declared within simulation model 1000 to designate count events having eventname "count1". The extended event identification procedure is described in the context of these extended event identifiers.

The uniqueness of the names in design entity name field 1034 is a primary distinguishing factor between events. By including the design entity name in the extended event identifier, each design entity is, in effect, given a unique namespace for the events associated with that design entity, i.e., events within a given design entity cannot have name collisions with events associated with other design entities.

It is still possible however, to have name collisions between events defined by different instrumentation entities that are incorporated within a single design entity. Events 1041 and 1042, for example, if identified solely by the design entity name, have a name collision. Both are events with eventname "count1" within design entity Z, and if labeled as such, are indistinguishable. In order to alleviate a naming collision between events 1041 and 1042, an instrumentation entity field 1032 can be employed. By referencing the design entity and instrumentation entity names, both of which are unique with respect to themselves and each other, a unique event namespace is created for each instrumentation entity associated with any given design entity. For example, event identifier 1041 and 1042 would be in conflict (both named Z.count1), unless the respective instrumentation entity names are included within the extended event identifier to produce names B1.Z.count1 and B2.Z.count2 for these events.

It should be noted that it is possible to uniquely name each event by using instrumentation entity name field 1032 alone. Due to the uniqueness property of instrumentation entity names, event names that are only named by the instrumentation entity name and the event name field will be necessarily unique.

However, such a naming scheme is insufficient for associating events with a given design entity. In practice, it is desirable to associate events with the design entity in which they occur rather than associating them with the potentially numerous instrumentation entities that are utilized to track them. Moreover, referencing the appropriate design entity within the eventname allows all the events associated with a given design entity to be centrally referenced without the need to ascertain the names of all the instrumentation entities associated with the given design entity. The data structure preferably utilizes both the instrumentation entity and design entity names in naming events for ease of reference at the cost of moderate uniqueness redundancy in the event names.

In an alternative embodiment, the instrumentation entity name is not included within the extended event identifier. Referring now to FIG. 8D, such an alternative extended event identification data structure is depicted. As shown in FIG. 8D, events are named by instantiation identifier field 1030, design entity name field 1034, and event name field 1036.

Such a data structure provides name collision protection between design entities but not within design entities. That is, the user must ensure that events names for events associated with a given design entity do not collide. In case of user error in this regard, model build tools may be utilized to detect an event name collision condition during model compilation. The alternative data structure depicted in FIG. 8D provides for simpler naming and referencing of events at the expense of requiring the user to prevent name collisions for events associated with a given design entity.

Returning to FIG. 8B, the combination of instrumentation entity field 1032, design entity name field 1034, and event-name field 1036 for a given event, provides a unique identifier for any given event without regard to multiple instantiations of the event. In order to uniquely distinguish between multiple instantiations of an event, instantiation identifier field 1030 is included in the extended event identifier. Instantiation identifier field 1030 field, by its construction, provides a unique string for any instance of an entity within any simulation model.

When evaluating occurrences of an event in a non-hierarchical sense, instantiation identifier field 1030 is ignored while searching for matching events. As illustrated in FIG. 8C, for example, a non-hierarchical query for the number of time a "count1" event occurs within design entity Z as detected by instrumentation entity B1, utilizes the following list of count eventnames:

| X1.Z | B1 | Z | COUNT1 |
| X2.Z | B1 | Z | COUNT1 |
| Y.Z | B1 | Z | COUNT1. |

These count events are added together to form an aggregate count of the total number of time the specific event occurred within the simulation model.

A hierarchical query includes specific criteria to match against the hierarchy field to limit the counter or counters found to specific instances of the requested event. For example, a query to obtain the count1 event of instrumentation entityB1 within the X1.Z instance of design entity Z utilizes the following count eventname:

| X1.Z | B1 | Z | COUNT1, | which represents the number of times the count1 event was counted by instrumentation entity B1 within design entity instance X1.Z for a particular simulation interval.

By providing matching model hierarchy criteria against instantiation identifier field 1030, it is possible to consider the events with respect to their particular instance or instances within the model, i.e., a hierarchical query. A non-hierarchical query merely ignores the hierarchy field and returns all the instances of the requested events within the model.

Figure 9A:
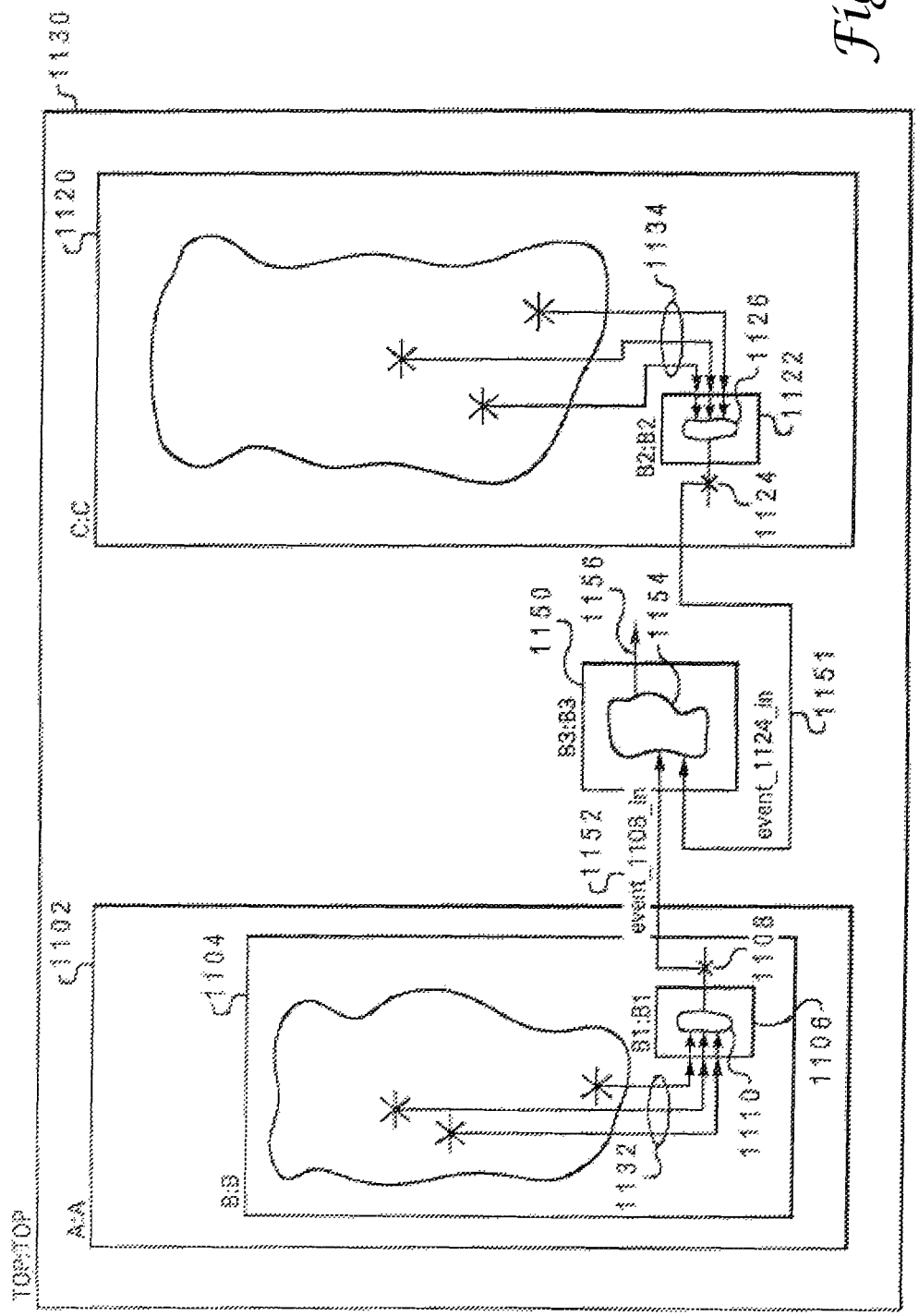
FIG. 9A is a block diagram illustrating a simulation model in which hierarchical event processing is applicable.

With reference to FIG. 9A, there is depicted a block diagram illustrating a simulation model 1100 in which hierarchical event processing is utilized. Simulation model 1100 comprises a top-level design entity 1130 in which a pair of lower-level design entities 1102 and 1120 is instantiated. A design entity 1104 containing instrumentation entity 1106 is included within design entity 1102. As illustrated in FIG. 11A, instrumentation entity 1106 includes logic 1110 for generating a simulation event 1108 from signal set 1132 from within design entity 1104. Design entity 1120 includes an instrumentation entity 1122 that generates a simulation event 1124 using signal set 1134.

Utilizing the techniques described hereinbefore, generating a hierarchical event that is some logical combination of events 1108 and 1124 requires the creation of an instrumentation entity associated with top level design entity 1130 that references signal sets 1132 and 1134. Conventionally, such an instrumentation entity would substantially reproduce instrumentation logic 1110 and 1126 to process signal sets 1132 and 1134, respectively, thus producing a copy of events 1108 and 1124. Such a procedure is inefficient and prone to error. If, for example, changes are made to any or all of signal sets 1132 and 1134, or instrumentation logic 1110 and 1126, these changes would have to be accurately repeated in the instrumentation entity logic for the combined event.

Events, such as events 1108 and 1124, can preferably be directly referenced and utilized as inputs to cross-hierarchical instrumentation entities. In this manner, signal connections 1132 and 1134, as well as instrumentation logic 1110 and 1126, are directly re-utilized to produce the desired hierarchical event.

To facilitate direct referencing of events within simulation models, a specialized data structure is implemented within instrumentation entity input port map comment syntax. This data structure directly connects input ports of instrumentation entities to cross-hierarchical events within a simulation model.

For the embodiment depicted in FIG. 9A, an instrumentation entity 1150 is instantiated within top-level design entity 1130 to generate a hierarchical event 1156 that is some function of events 1108 and 1124. As illustrated in FIG. 9A, instrumentation entity 1150 includes a pair of inputs 1151 and 1152 that are directly connected to events 1124 and 1108, respectively, utilizing the augmented syntax described below. These input connections are logically combined using instrumentation logic 1154 to produce a cross-hierarchical event 1156.

With reference to FIG. 9B, there is depicted a set of input port mapping comments for performing cross-hierarchical processing of simulation model events in accordance one or more embodiments. In what follows, it is assumed that events 1108 and 1124 are count events with event names event_1108 and event_1124, respectively, and that these events are connected to input ports event_1108_in and event_1124_in on instrumentation entity 1150. As depicted in FIG. 9B, a first input port mapping comment 1161 contains data for referencing event 1108 to input port event_1108_in. A second input port mapping comment 1162 contains data for referencing event 1124 to input port event_1124_in. It should be noted that each of input port mapping comments 1161 and 1162 includes a pre-pended non-conventional comment identifier, --!!, that is utilized by the HDL compiler (such as compiler 462 in FIG. 3D) to maintain the port mapping comments separate from the design.

To facilitate connection of a simulation event to an instrumentation entity input port, input port mapping comments 1161 and 1162 include two distinct parts: an instance identifier and an event identifier. The instance identifier is a string including instance names (in descending hierarchical order) of all design entities between and including the design entity containing the instrumentation entity of the cross-hierarchical event being defined (i.e., the highest level design entity for the cross-hierarchical event), and the design entity in which the event that is utilized in generating the cross-hierarchical event. If the design entity containing the hierarchical event is the same as the design entity containing the event to be connected to, the instance identifier is a null string. A pair of instance identifiers 1163 and 1164, within input port mapping comments 1161 and 1162, respectively, specify that events 1124 and 1108 originate from signals within design entity 1120 and 1104 respectively.

Input port mapping comments 1161 and 1162 further include event identifiers 1165 and 1166, that identify input simulation events in terms of local instrumentation entities 1106 and 1122, respectively. In accordance with the embodiment depicted in FIG. 9B, each event identifier includes a string beginning with an open bracket ("[") character and ending with a closed bracket ("]") character. Between these brackets, three sub-strings, delineated by period (".") characters, comprise a data structure utilized to identify a specific event from which the cross-hierarchical event is defined. The first sub-string within an event identifier is the instance name of the instrumentation entity containing the event. The second sub-string is a string specifying the type of the event ("count", "fail", or "harvest"). Finally, the third sub-string is the event name of the given event as specified in the declaration comment for the event. Each event identifier string uniquely identifies a single event within a given design entity. As depicted in FIG. 9B, event identifier strings 1165 and 1166 identify events 1108 and 1124 respectively.

In accordance with an alternate embodiment, the event identifier naming structure is modified slightly for events that are labeled in accordance with FIG. 8D (event names that do not include the instrumentation entity name). When an instrumentation identifier is absent from the extended event identifier, the event identifier string with an input port mapping comment includes two sub-strings: a string denoting the type of event to connect to; and a string providing the name of the event separated by a period (".") character. The instrumentation entity name is not required in this case since all events of a given type associated with a given design entity will have unique names. The model build tools will automatically search all instrumentation entities associated with the design entity called out by the instance identifier to determine which instrumentation entity generates an event having the name and type provided in the event identifier string.

Referring to FIG. 9C, there is illustrated a set of data structures for performing hierarchical processing of simulation model events in accordance with a second embodiment. In the depicted embodiment, a pair of input port mapping comments 1171 and 1172 employs a syntax compatible with the event naming data structure depicted in FIG. 8D.

Input port mapping comment 1171 connects event 1108 to input port event 1108 in on instrumentation entity 1150. Likewise, input port mapping comment 1172 connects event 1124 to input port event 1124 in on instrumentation entity 1150. By utilizing the augmented syntax of FIG. 9B or FIG. 9C, it is possible to create hierarchical events by connecting the inputs of instrumentation entities to events within the simulation model.

The above described systems and methods provide for practical instrumentation of simulation models and allows for efficient implementation of instrumentation logic through embedded instrumentation entities. Embedded instrumentation entities as described hereinabove are, however, necessarily limited to task-specific implementations. As described with reference to FIGS. 10A and 10B, instrumentation logic can be declared in a more flexible and unstructured manner.

Figure 10A:
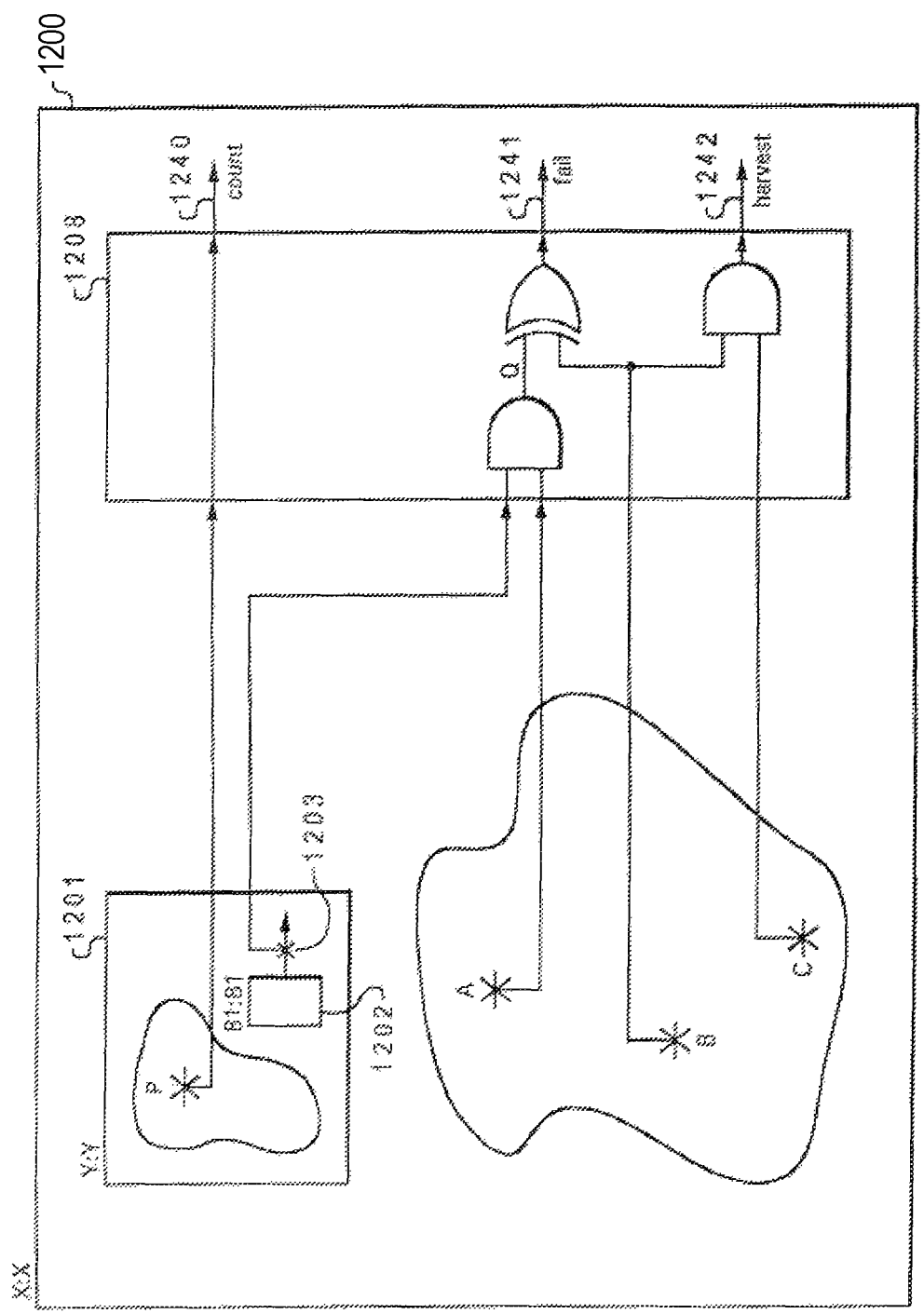
FIG. 10A depicts a representative target design entity with an instrumentation entity containing random instrumentation logic implemented in accordance one or more embodiments.

It is often necessary to tailor instrumentation logic to address unique problems and circumstances. Instrumentation logic of a specific and yet non-predefined nature that is designed in accordance with the techniques disclosed herein with reference to FIGS. 10A and 10B is referred herein as "random instrumentation logic." A data construct including general logic primitives (Boolean operators, storage elements, etc.) and an interconnection method for these primitives can be utilized to implement such random instrumentation logic.

To instrument a simulation model as described heretofore, an HDL such as VHDL or Verilog is utilized as a platform from which instrumentation logic is generated. Appropriate instrumentation entity descriptor comments within design entity source code files couple the resultant instrumentation entities to designated target design entities within a simulation model.

In addition to entity descriptor comments within a design entity source code file, the foregoing instrumentation technique requires a separate HDL file in which the instrumentation entity is described. As explained with reference to FIGS. 10A and 10B, design entities within a simulation model can be instrumented while avoiding the design process overhead required for creating a separate instrumentation entity HDL file.

In accordance one or more embodiments, random instrumentation logic is directly deployed within target design entities in terms of individualized and customizable instrumentation descriptor comments. Such instrumentation descriptor comments are encoded within the target design entity HDL source code file and provide a means for the describing random instrumentation logic, events, and interconnections between the created instrumentation logic and the target design entity. The random instrumentation logic is inserted into the simulation model in a manner similar to the techniques used for embedded instrumentation entities to produce an instrumentation entity without the need for the creation of an explicit HDL instrumentation entity file.

With reference to FIG. 10A, there is illustrated a representative target design entity 1200 in which random instrumentation logic is implemented in accordance with one or more embodiments. Instantiated within target design entity 1200 is a design entity 1201. As further depicted in FIG. 10A, an instrumentation entity 1202 is instantiated within design entity 1201. Instrumentation entity 1202 is designed in accordance with the principles set forth hereinabove to generate a count event 1203 having an event name "count1." Target design entity 1200 further includes an instrumentation entity 1208 that is generated utilizing random instrumentation logic. As depicted in FIG. 10A, instrumentation entity 1208 receives as inputs signals P, A, B, and C along with count event 1203.

Instrumentation entity 1208 is constructed by a set of unconventional comments lines within the source code file for target design entity 1200. These comments may be incorporated at any point within the logic description section of the HDL source code file. HDL compiler 462 (FIG. 3B) recognizes the unconventional comments in addition to any comments utilized to instantiate embedded instrumentation entities within design entity 1200. During the post-compilation/model build phase, instrumentation load tool 464 processes these comments in a manner similar to that utilized for embedded instrumentation entities (described with reference to FIGS. 8A-8D) to generate instrumentation entity 1208.

A variety of possible syntaxes can be utilized to formulate the unconventional HDL comments required for generating random instrumentation logic within the source code file of a target design entity. As depicted in FIG. 10B, much of the syntax of these comments employs syntax similar to the concurrent subset of the VHDL language with the addition of syntactic and semantic enhancements that provide a means of connection between an instrumentation entity and its target design entity. In addition, minor syntactic and semantic enhancements are provided to declare events and intermediate signals.

With reference now to FIG. 10B, there is illustrated an exemplary HDL source code file 1220 that describes design entity 1200. Within HDL source code file 1220, an entity instantiation 1221 produces design entity 1201, and assignment statements 1222 are utilized to generate signals A, B, and C. A set of unconventional comments 1223 within HDL source code file 1220 is utilized to produce instrumentation entity 1208. Comments 1223 are formulated as left-hand side (l.h.s.)/right-hand side (r.h.s.) assignment statements of the form:

{l.h.s.}<={r.h.s.};

where {l.h.s.}, referred to herein after as lhs, is the assignment statement target and, {r.h.s}, referred to herein after as rhs is an expression denoting the logical value to be assigned to the statement lhs. A number of rules delineate the possible expressions for lhs and rhs in any legal statement in the instrumentation comments.

As employed within the instrumentation data structure, an lhs statement may be either an event declaration or the name of a signal that is instantiated within an instrumentation entity. An event declaration is an expression within bracket characters ("[A, A]") that generates a new event. Within comments 1223, a statement 1230 produces a count event 1240 from instrumentation entity 1208 (FIG. 10A) having eventname "countname0".

Within an lhs event declaration, a first field designates the event type (count, fail, harvest, etc.) and is followed by such other fields as are necessary to declare the event. As illustrated in lines 1230, 1234, and 1236, such event declaration fields follow the same format as the event declaration fields depicted in FIG. 3C.

Comments 1223 further include a line 1232 having an lhs that declares a signal Q within instrumentation entity 1208. To prevent ambiguity, any signal declared in this manner may not have a name corresponding to the name of any signal present on the top level of target design entity 1200. Conformance to this requirement is verified by instrumentation load tool 464 (FIG. 3D) during processing. Signals declared by an lhs expression may be incorporated within an rhs expression as shown in lines 1232 and 1234.

An rhs includes logical connectivity expressions and/or functions that combine various signals. Signals within these connectivity expressions may originate from a number of possible sources including: signals declared on the lhs of a statement in the instrumentation comments; signals within the target design entity; or signals designating other events within the target design entity.

The absence of period (".") or bracket ("[", "]") characters within a signal value description in the rhs of a statement, designates the object signal as corresponding to either a signal within the top hierarchical level of the target design entity or to a signal declared on the lhs of a statement within the instrumentation language. Signals are named in a mutually exclusive manner by the rules governing creation of signals on the lhs of a statement in the instrumentation comments, thereby preventing any ambiguity in the determining the source of the given signal.

Signals in rhs connectivity expressions can also be connections to signals within entities instantiated within the target design entity. In such a circumstance, the instance names of the entity or entities in the hierarchy enclosing the desired signal are placed before the signal name in hierarchy order, delineated by period (".") characters. For example, the signal in statement 1230 ("Y.P") represents signal 1204 within design entity 1201. Signals at any level of the target design hierarchy are thus accessible to instrumentation logic generated by the instrumentation language comments.

Signals within the instrumentation comment expressions can also designate other events within the target entity. Event identifiers as described hereinbefore for hierarchical events are used to denote such "event" signals. For example, statement 1232 performs a logical AND of instrumentation event 1203 and signal A. The event identifier "Y.[B1.count.count1]" connects instrumentation entity 1208 to instrumentation event 1203. This notation permits instrumentation events at any level of design hierarchy within target design entity 1200 to be directly accessed.

As further depicted in FIG. 10B, statement 1232 produces intermediate signal Q within instrumentation entity 1208. This is an example of an instrumentation comment statement declaring a new intermediate signal. These signals can be used in other statements to construct random instrumentation logic of any desired depth or complexity.

Statement 1234 utilizes intermediate signal Q along with signal 1206 to produce fail event 1241. The syntax for fail event declaration includes a field denoting the type of event ("fail"), a field giving the event name for the fail event ("failname0"), and a final field denoting the message to associate with the fail. Finally, statement 1236 produces harvest event 1242.

In general, the rhs expression of any statement in the instrumentation data structure can access any signal or instrumentation event signal within the target design entity utilizing these syntactic mechanisms. These signals can be combined to form new events or intermediate signals that can themselves be further combined to form instrumentation logic of any desired depth or complexity.

Instrumentation comments can be placed anywhere within the logic description section of the target entity source code file. All instrumentation comments within a file are considered as a whole and produce a single instrumentation entity within the target design entity.

It is often necessary to override signal values within a simulation model to test various functions and create certain conditions that would otherwise not be possible or simple to obtain. To provide an efficient and designer accessible means of overriding signal values within a simulation model, specialized signal override output ports and logic can be incorporated into instrumentation entities that permit bus signal overrides during model simulation. Such signal override output ports must have different names that the outputs for count, fail, and harvest events, and compliance with this condition is verified by instrumentation load tool 464 (FIG. 3D) during the model build process.

The signal override output ports may be declared explicitly as ports in the HDL source code file of an explicitly represented instrumentation entity. For an embedded instrumentation entity or instrumentation entities produced by random instrumentation logic comments within a target design entity, the signal override output ports are automatically generated by instrumentation load tool 464. The signal override output ports are described in output port map statements that declare an alternate value that overrides a given simulation signal. Such an output port map statement further declares the conditions under which the simulation signal will be overridden. For each simulation signal (single or multi-bit) to be overridden, two output signals are produced: one providing the override signal value and another in the form of a single bit signal that enables or disables overriding of the simulation signal.

For at least some simulation models, it would be desirable to implement instrumentation logic that generates an event having different event types (e.g., fail, count, harvest, etc.) depending on a hierarchy level (e.g., unit, chip, nest or system) at which a simulation run is performed. As one example, it may be desirable when simulating at a lower hierarchy level (e.g., a "unit" level representing a single unit of the design) to drive inputs of the unit to a combination of values that in ordinary operation would be illegal in order to exercise a "hardened" design of a unit in the presence of the illegal input combinations. In such a case, it would be useful and desirable to count occurrences of the illegal input combinations to ensure coverage of at least some of the illegal input combinations. However, at higher hierarchy levels at which the unit is encapsulated by more of the simulation model (e.g., chip, nest (i.e., multiple chips coupled to an interconnect) or system), it may be preferable to simply flag the illegal input combinations as a failure without counting occurrences. This ability for a single instrumentation event to be classed as different event types (e.g., in the above example, a count event and a fail event) depending on the level of simulation has heretofore not been available.

In order to support such simulation level-dependent multitype events, a simulation levels file 490 is provided as one of the inputs to HDL compiler 462, as noted above with reference to FIG. 3D. Simulation levels file 490 preferably defines the level(s) of simulation to which the other input files 340, 345, 460 and 461 are applicable. In one exemplary embodiment, simulation levels file 490 can include one or more lines, each of which contains an enumerated string specifying a legal simulation level. In this exemplary embodiment, if four levels of simulation are to be supported by a particular model, simulation levels file 490 may specify the following string values:

unit
chip
nest
system

Generally, the legal set of simulation levels defined by simulation levels file 490 is a project convention set at the beginning of the project and maintained throughout the project.

During compilation, if HDL compiler 462 detects that an instrumentation entity HDL file 461 or design entity HDL file 340 references a simulation level not found in the set of legal simulation levels specified by simulation levels file 490, that reference is handled as an error at compile time. If compilation is successful, the legal set of simulation levels is preferably encoded in all the instrumentation entity proto files and design entity proto files generated by HDL compiler 462. If on a subsequent compilation the content of the simulation levels file 490 differs from when one or more of the input proto files 345, 460 was originally compiled, then HDL compiler 462 recompiles the affected proto file(s) 345 and/or 460.

To define an instrumentation entity that generates a level-dependent multitype event, a set of unconventional comments as described above may be utilized. For example, assuming use of random instrumentation logic comments as discussed above with reference to FIGS. 10A-10B, exemplary syntax for creating a level-dependent multitype event can be given as follows:

```
--!! [count, countname0, clock](unit, chip);
--!! [fail, failname0, "fail msg"](nest, system);
--!! [harvest, harvestname0, "harvest msg"]( ) <= B and C;
```

In this exemplary syntax, a parenthetical simulation levels field is inserted following each bracketed event identifier. The parenthetical simulation levels field specifies the hierarchical levels of simulation for which the instrumentation event is valid. In this example, the count event is valid for the unit and chip levels of simulation, the fail event is valid for the nest and system levels of simulation, and the harvest event is valid for all simulation levels, as indicated by empty parenthesis. It should be noted that although the unconventional comment spans multiple lines in this example, the unconventional comment could alternatively be written as a single line of code. It should further be appreciated that in alternative embodiments, the level-dependent multitype event can be specified by alternative syntax, such as the exemplary syntax employed in FIG. 3C.

Figure 11:
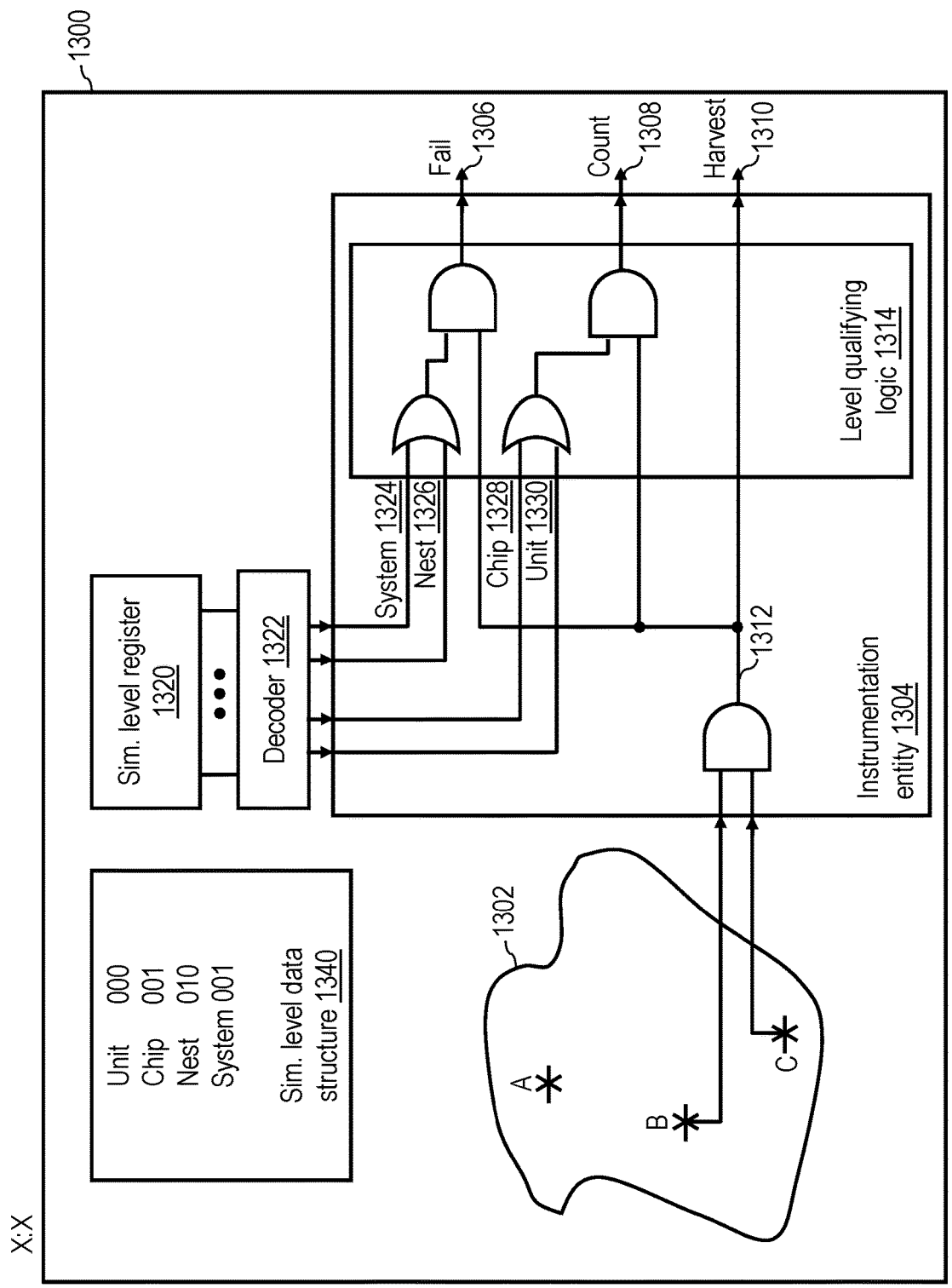
FIG. 11 depicts a representative target design entity with an instrumentation entity containing instrumentation logic that produces a level-dependent multitype event in accordance one or more embodiments.

Referring now to FIG. 11, there is illustrated a representative target design entity 1300 in which random instrumentation logic that generates a level-dependent multitype event is implemented in accordance with the exemplary syntax given above.

As shown, target design entity 1300 includes design logic 1302 that generates exemplary signals A, B and C. Target design entity 1300 further includes an instrumentation entity 1304 constructed by instrumentation load tool 464 from the set of unconventional comments above, which can be embedded within the source code file for target design entity 1300. Instrumentation logic 1304 includes instrumentation logic that generates a fail event 1306 having an event name "failname0," a count event 1308 having the event name "countname0," and a harvest event 1310 having the event name "harvestname0." As shown, in this example, the instrumentation logic of instrumentation entity 1304 generates an instrumentation signal 1312 by performing the logical AND of input signals B and C. The instrumentation logic within instrumentation entity 1304 further includes level qualifying logic 1314 that qualifies instrumentation signal 1312 to form alternative and/or additional types of instrumentation events that are dependent on simulation level.

To order to support formation of level-dependent multitype instrumentation events, instrumentation load tool 464 instantiates within target design entity 1300 a simulation level register 1320 that specifies the simulation level for the simulation model. In addition, instrumentation load tool 464 instantiates a decoder 1322 coupled to simulation level register 1320. Decoder 1322 decodes the simulation level indicated by simulation level register 1320 and produces a respective decoded signal corresponding to each of the possible simulation levels. For example, in this case, decoder 1322 generates a system signal 1324, nest signal 1326, chip signal 1328 and unit signal 1330, which are asserted if simulation level register 1320 specifies a system level, nest level, chip level or unit level simulation, respectively. Instrumentation load tool 464 also places within the simulation model (in this case within target design entity 1300 but in other embodiments elsewhere in the simulation model) a simulation level data structure 1340 that provides a mapping between the enumerated strings values specified in simulation levels file 490 and the register values that can be loaded into simulation level register 1320.

The signals 1324-1330 generated by decoder 1322 are received as inputs by level qualifying logic 1314, which implements, for each level-dependent multitype event, logic that qualifies level-dependent events based on the parenthetical simulation levels fields of the unconventional comments. Thus, in the present example, level qualifying logic 1314 implements logic to form the logical OR of the system signal 1324 and nest signal 1326 to qualify fail event 1306 so that it is only output if the simulation is performed at the system level or nest level. Similarly, level qualifying logic 1314 implements logic to form the logical OR of chip signal 1328 and unit signal 1330 to qualify count event 1308 so that it is only output if the simulation is performed at the chip level or unit level. Because the harvest event 1310 is applicable to all simulation levels, level qualifying logic simply passes through instrumentation signal 1312 unqualified to form a harvest event 1310. While FIG. 11 illustrates only a few exemplary event types, those skilled in the art will appreciate that other instrumentation event types can be defined as level-dependent, multitype events through application of the techniques disclosed herein.

It should be noted that for a level-dependent multitype event, it is presently preferred that level qualifying logic 1314 generates all event types of the multitype event, even if the simulation model will use less than all of the event types. This design choice simplifies data collection at the end of a simulation run and ensures that any cross-hierarchy event connections (as discussed above with reference to FIG. 9) work appropriately. In an alternative embodiment, a simulation model can instead be compiled for a particular simulation level and exclude from the simulation model those event types that are inapplicable for a desired simulation level. However, this alternative embodiment requires additional processing, for example, to handle dangling event references at compile time and to perform data collection following simulation (e.g., because the list of count events can change between simulation models). The tradeoffs between model size and processing associated with these design choices will be apparent to those skilled in the art.

Figure 12:
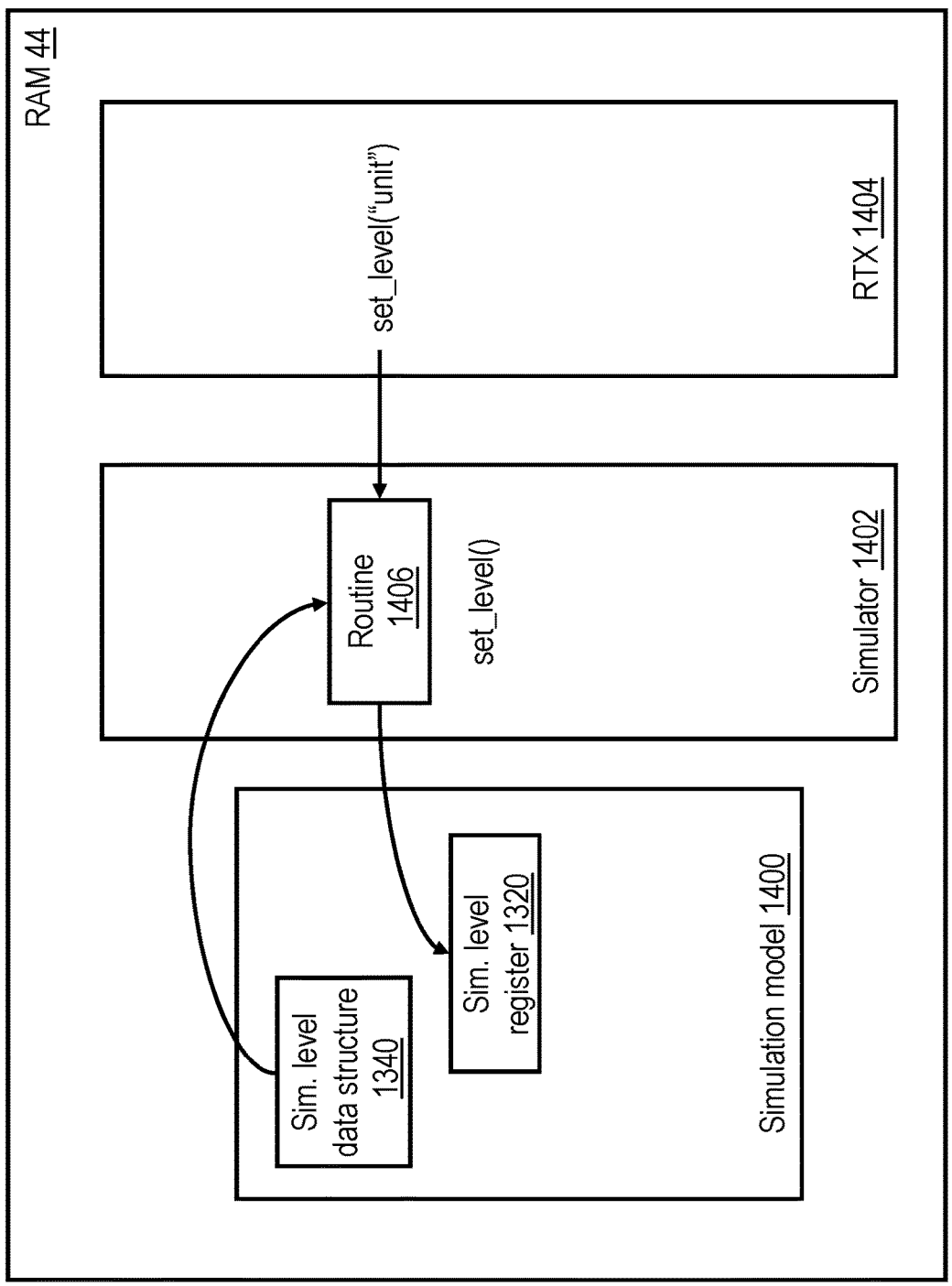
FIG. 12 is a block diagram depicting data content within a memory of a data processing system during a simulation run of a simulation model.

Referring now to FIG. 12, there is depicted a block diagram of the content of RAM 44 (FIG. 2) during a simulation run of a simulation model 1400. RAM 44 includes the elements necessary for monitoring exemplary model events including a software simulator 1402 that simulates simulation model 1400 under the control of an RTX (Run Time eXecutive) 1404, which is a control program that may be written in a high-level language such as C or C++. To facilitate RTX control and execution of a simulation run, simulator 1402 provides a number of application program interface (API) functions that may be called by RTX 1404. Such API functions employ routines, protocols, and tools that allow for polling of signals within simulation model 1400, alteration of signals within simulation model 1400, cycling of simulation model 1400, etc.

In FIG. 12, RTX 1404 calls a routine 1406 named "set_level( )" within simulator 1402 and provides a parameter corresponding to the simulation level of the simulation run (e.g., "unit"). Routine 1406 examines simulation level data structure 1340 within the simulation model 1400 to determine if the parameter is a legal enumerated value. If not, routine 1406 does not set a simulation level for the simulation run and returns an error to RTX 1404. If, on the other hand, the parameter specified for the set_level( ) call is a legal enumerated value, routine 1406 uses the value found in simulation level data structure 1340 to set simulation level register 1320 with the value for the appropriate simulation level. With simulation level register 1320 set appropriately, simulation model 1400 will enable one or more level-dependent multitype events during the simulation run as described above with reference to FIG. 11, and these events are recorded by simulator 1402 in data storage for subsequent examination, analysis and/or presentation.

As has been described, in one embodiment, a processor of a data processing system creates level qualifying logic within instrumentation of a hardware description language (HDL) simulation model of a design. The level qualifying logic is configured to generate a first event of a first type for a first simulation level and to generate a second event of second type for a second simulation level. The processor simulates the design utilizing the HDL simulation model, where the simulation includes generating the first event of the first type responsive to the simulating being performed at the first simulation level and generating the second event of the second type responsive to the simulating being performed at the second simulation level. Responsive to the simulating, the processor records, within data storage, at least one occurrence of an event from a set including the first event and the second event.

While various embodiments have been particularly shown as described, it will be understood by those skilled in the art that various changes in form and detail may be made therein without departing from the spirit and scope of the invention. For example, although one or embodiments have been described with reference to a data processing system executing program code, the instructions and/or data forming the program code may be stored in a storage device, such as a magnetic or solid state drive, an optical disk, or a flash drive. The storage device and the instructions and/or data (the "program code") stored therein form a manufacture that may be referred to herein as a "program product." It should be understood that as used herein, the term "storage device" refers only to statutory manufactures and therefore excludes non-statutory embodiments, such as transient signals per se, transmission media per se, and forms of energy per se.

What is claimed is:

1. A method of simulation processing in a data processing system, said method comprising:
    a processor of the data processing system instrumenting a plurality of design entities of a hardware description language (HDL) simulation model of a design of an integrated circuit, wherein the instrumenting includes creating, within instrumentation of the HDL simulation model, level qualifying logic configured to generate a first event of a first type for a first simulation level of an instrumentation signal generated by the instrumentation and to generate a second event of second type for a second simulation level of the instrumentation signal;
    the processor simulating the design of the integrated circuit utilizing the HDL simulation model, wherein the simulating includes generating a multiplicity of signals in the design entities and the instrumentation generating the first event of the first type responsive to the simulating being performed at the first simulation level and the instrumentation generating the second event of the second type responsive to the simulating being performed at the second simulation level; and
    responsive to the simulating, the processor recording, within data storage, at least one occurrence of an event from a set including the first event and the second event.

2. The method of claim 1, wherein the creating includes creating the level qualifying logic responsive to receipt of at least one HDL file specifying the instrumentation in at least one comment.

3. The method of claim 1, wherein:
    the creating further includes creating, in the HDL simulation model, a simulation level register; and
    the method further comprises prior to the simulating, setting the simulation level register to specify one of the first simulation level and the second simulation level.

4. The method of claim 3, wherein the setting comprises setting the simulation level in response to validating a parameter of a set level command.

5. The method of claim 1, wherein the first level and second level are different simulation levels selected from a set including a unit level, a chip level, a nest level and a system level.

6. A data processing system, said data processing system comprising:
    a processor;
    data storage coupled to the processor, wherein the data storage includes program code, that when executed by the processor, causes the data processing system to perform:
        instrumenting a plurality of design entities of a hardware description language (HDL) simulation model of a design of an integrated circuit, wherein the instrumenting includes creating, within instrumentation of the HDL simulation model, level qualifying logic is configured to generate a first event of a first type for a first simulation level of an instrumentation signal and to generate a second event of second type for a second simulation level of the instrumentation signal;
        simulating the design of the integrated circuit utilizing the HDL simulation model, wherein the simulating includes generating a multiplicity of signals in the design entities and the instrumentation generating the first event of the first type responsive to the simulating being performed at the first simulation level and the instrumentation generating the second event of the second type responsive to the simulating being performed at the second simulation level; and
        responsive to the simulating, recording, within the data storage, at least one occurrence of an event from a set including the first event and the second event.

7. The data processing system of claim 6, wherein the creating includes creating the level qualifying logic responsive to receipt of at least one HDL file specifying the instrumentation in at least one comment.

8. The data processing system of claim 6, wherein:
    the creating further includes creating, in the HDL simulation model, a simulation level register; and
    the program code further causes the data processing system to perform:
        prior to the simulating, setting the simulation level register to specify one of the first simulation level and the second simulation level.

9. The data processing system of claim 8, wherein the setting comprises setting the simulation level in response to validating a parameter of a set level command.

10. The data processing system of claim 6, wherein the first level and second level are different simulation levels selected from a set including a unit level, a chip level, a nest level and a system level.

11. A program product, comprising:
    a storage device;
    program code stored within the storage device, wherein the program code, when executed by a processor of a data processing system, causes the data processing system to perform:

instrumenting a plurality of design entities of a hardware description language (HDL) simulation model of a design of an integrated circuit, wherein the instrumenting includes creating, within instrumentation of the HDL simulation model, level qualifying logic is configured to generate a first event of a first type for a first simulation level of an instrumentation signal and to generate a second event of second type for a second simulation level of the instrumentation signal;

simulating the design of the integrated circuit utilizing the HDL simulation model, wherein the simulating includes generating a multiplicity of signals in the design entities and the instrumentation generating the first event of the first type responsive to the simulating being performed at the first simulation level and the instrumentation generating the second event of the second type responsive to the simulating being performed at the second simulation level; and responsive to the simulating, recording, within the data storage, at least one occurrence of an event from a set including the first event and the second event.

12. The program product of claim 11, wherein the creating includes creating the level qualifying logic responsive to receipt of at least one HDL file specifying the instrumentation in at least one comment.

13. The program product of claim 11, wherein:
the creating further includes creating, in the HDL simulation model, a simulation level register; and
the program code further causes the data processing system to perform:
prior to the simulating, setting the simulation level register to specify one of the first simulation level and the second simulation level.

14. The program product of claim 13, wherein the setting comprises setting the simulation level in response to validating a parameter of a set level command.

15. The program product of claim 11, wherein the first level and second level are different simulation levels selected from a set including a unit level, a chip level, a nest level and a system level.

* * * * *